(12) United States Patent
Coteus et al.

(10) Patent No.: US 10,102,884 B2
(45) Date of Patent: Oct. 16, 2018

(54) DISTRIBUTED SERIALIZED DATA BUFFER AND A MEMORY MODULE FOR A CASCADABLE AND EXTENDED MEMORY SUBSYSTEM

(71) Applicant: International Business Machines Corporation, Armonk, NY (US)

(72) Inventors: Paul W. Coteus, Yorktown, NY (US); Daniel M. Dreps, Georgetown, TX (US); Charles A. Kilmer, Essex Junction, VT (US); Kyu-hyoun Kim, Chappaqua, NY (US); Warren E. Maule, Cedar Park, TX (US); Todd E. Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 14/920,610

(22) Filed: Oct. 22, 2015

(65) Prior Publication Data

US 2017/0115930 A1 Apr. 27, 2017

(51) Int. Cl.
*G11C 5/04* (2006.01)
*G11C 7/10* (2006.01)

(52) U.S. Cl.
CPC ............... *G11C 5/04* (2013.01); *G11C 7/109* (2013.01)

(58) Field of Classification Search
CPC .... G06F 3/0656; G06F 3/0604; G06F 3/0683; G11C 5/04; G11C 7/109
See application file for complete search history.

(56) References Cited

U.S. PATENT DOCUMENTS

| | | | |
|---|---|---|---|
| 6,437,789 B1 * | 8/2002 | Tidwell | G06F 12/0848 345/531 |
| 6,925,534 B2 | 8/2005 | David | |
| 8,139,430 B2 | 3/2012 | Buchmann et al. | |
| 8,166,218 B2 | 4/2012 | Rajamani | |
| 8,296,541 B2 | 10/2012 | Gower et al. | |
| 8,493,797 B2 * | 7/2013 | Klein | G11B 7/14 365/185.33 |
| 2004/0046707 A1 * | 3/2004 | Mori | G06F 3/1431 345/1.1 |

(Continued)

OTHER PUBLICATIONS

Zheng et al.; "Decoupled DIMM: Building High-Bandwidth Memory System Using Low-Speed DRAM Devices", 2009, Proceedings of the 36th annual international symposium on Computer architecture, pp. 255-266.

(Continued)

*Primary Examiner* — Mano Padmanabhan
*Assistant Examiner* — Patrick W Borges
(74) *Attorney, Agent, or Firm* — Patterson + Sheridan, LLP

(57) ABSTRACT

Embodiments disclosed herein generally relate to techniques for routing data through one or more cascaded memory modules. Each memory module can include a plurality of data buffers. Each data buffer includes a plurality of ports for routing data to and/or from other memory modules. In one embodiment, the data buffer is configured to route write data to DRAM devices on a first memory module or route write data to a data buffer of at least one downstream memory module. The data buffer is also configured to receive read data from a DRAM device of the first memory module or receive read data from a downstream memory module.

14 Claims, 20 Drawing Sheets

(56) References Cited

U.S. PATENT DOCUMENTS

| | | | |
|---|---|---|---|
| 2006/0023482 A1* | 2/2006 | Dreps | G11C 5/04 |
| | | | 365/63 |
| 2006/0095620 A1 | 5/2006 | Dreps et al. | |
| 2007/0085561 A1* | 4/2007 | Friebe | G06F 13/4239 |
| | | | 326/30 |
| 2008/0091906 A1* | 4/2008 | Brittain | A61C 17/349 |
| | | | 711/167 |
| 2008/0222351 A1* | 9/2008 | Verdiell | G06F 13/4234 |
| | | | 711/104 |
| 2013/0036287 A1 | 2/2013 | Chu et al. | |
| 2013/0148448 A1 | 6/2013 | Matsui | |
| 2013/0208524 A1 | 8/2013 | Sung et al. | |
| 2014/0313838 A1 | 10/2014 | Chiu et al. | |
| 2014/0325315 A1 | 10/2014 | Warnes et al. | |
| 2014/0337539 A1* | 11/2014 | Lee | G06F 3/0659 |
| | | | 710/5 |
| 2015/0003172 A1 | 1/2015 | Kim et al. | |

OTHER PUBLICATIONS

Farmahani-Farahani et al.; "NDA: Near-DRAM Acceleration Architecture Leveraging Commodity DRAM Devices and Standard Memory Modules", 2015 IEEE 21st International Symposium on High Performance Computer Architecture (HPCA), pp. 283-295.

Jung Ho Ahn et al.; "Multicore DIMM : An Energy Efficient Memory Module With Independently Controlled DRAMs", IEEE Computer Architecture Letters, vol. 8, No. 1, 2009, pp. 5-8.

* cited by examiner

DISTRIBUTED SERIALIZED DATA BUFFER AND A MEMORY MODULE FOR A CASCADABLE AND EXTENDED MEMORY SUBSYSTEM

BACKGROUND

The present disclosure generally relates to memory systems, and more specifically, to a memory module with a distributed, serialized data buffer for a cascadable, extended memory system.

Modern computer memory systems typically store data or information within memory modules, examples of which include single-in-line memory modules (SIMMs), dual-in-line memory modules (DIMMs), and the like. Each memory module includes a plurality of discrete memory devices, such as dynamic random access memory (DRAM) devices, asynchronous DRAM devices, synchronous DRAM (SDRAM) devices, etc., that can be accessed, via one or more buses, by a processor or memory controller. The plurality of memory devices are typically organized into ranks, which generally refers to a set of memory devices that can be selected (or accessed) via the same control signal from the processor or memory controller.

In addition, most memory systems today employ double data rate (DDR) memory, which is a type of SDRAM. DDR memory, in general, provides increased access speed by transferring data on both the rising and falling edges of a clock signal. Examples of DDR SDRAM include any of the versions of the DDR SDRAM specification from JEDEC (e.g., DDR4 SDRAM, DDR3 SDRAM, DDR2 SDRAM, etc.). DDR memory, now in its fourth generation (e.g., DDR4 SDRAM), is characterized by bidirectional data lines, with one signal contact per line (generally referred to as single-ended signaling). In addition, there is a unidirectional, single-ended command and address bus, which generally runs at half the speed of the data bus. The DRAM clock uses two signal contacts per line, each an inverse of the other (generally referred to as differential signaling).

As the demand for faster memory continues to increase, modern electronic devices such as processors and memory continue to improve by operating the devices at higher clock speeds. However, as computers and computer processors continue to increase in performance, the need to operate at higher clock speeds has prompted new issues to emerge as areas of concern. One such issue relates to increased latency experienced when accessing DRAM devices within a memory module.

SUMMARY

One embodiment presented herein includes a memory module, which includes a plurality of DRAM devices, a command buffer and at least one data buffer. The command buffer is configured to receive a set of commands to access data at one or more memory locations of the DRAM devices on the memory module or DRAM devices on at least one downstream memory module. The at least one data buffer is configured to receive, via a first port of the data buffer, write data for the commands, and is configured to route the write data to a DRAM device on the memory module or route the write data to a data buffer of the downstream memory module via a second port of the data buffer. The at least one data buffer is also configured to receive read data, in response to the commands, from a DRAM device of the memory module or receive read data from the downstream memory module via a third port of the data buffer, and is configured to route the read data to a fourth port of the data buffer.

Another embodiment describes a method for routing data by a first memory module. The method generally includes receiving, by a command buffer of the first memory module, a set of commands to access data at one or more memory locations of DRAM devices on the first memory module or at least one downstream memory module. The method also includes receiving, via a first port of a data buffer of the first memory module, write data for the commands, wherein the data buffer is configured to route the write data to a DRAM device on the first memory module or to route the write data to a data buffer of the downstream memory module via a second port of the data buffer. The method further includes receiving read data, in response to the commands, from a DRAM device of the first memory module or receiving read data from the downstream memory module via a third port of the data buffer, wherein the data buffer is configured to route the read data to a fourth port of the first data buffer.

Still another embodiment includes a memory system which includes a plurality of cascaded memory modules. Each memory module includes a plurality of DRAM devices, a command buffer, and at least one data buffer. The command buffer is configured to receive a set of commands to access data at one or more memory locations of the DRAM devices on the memory module or DRAM devices on at least one downstream memory module. The at least one data buffer is configured to receive, via a first port, write data for the commands, and is configured to route the write data to a DRAM device on the memory module or to route the write data to a data buffer of the downstream memory module via a second port. The at least one data buffer is also configured to receive read data, in response to the commands, from a DRAM device of the memory module or to receive read data from the downstream memory module via a third port, and is configured to route the read data to a fourth port.

Other embodiments include, without limitation, a computer-readable medium that includes instructions that enable a processing unit to implement one or more aspects of the disclosed methods as well as a system having a processor, memory, and application programs configured to implement one or more aspects of the disclosed methods.

DETAILED DESCRIPTION

Embodiments presented herein provide a distributed data buffer that allows for cascading memory modules for a cascadable and extended memory system. Each memory module includes a plurality of distributed data buffers, a command buffer and a plurality of memory devices (e.g., DRAM devices, etc.). The memory modules are configured to perform one or more memory operations in response to commands received from a processor or memory controller. Examples of the commands can include, but are not limited to, commands for read, write, pre-charge, refresh, etc. As described in more detail below, the techniques presented herein allow for accessing the memory devices in one or more cascaded memory modules with reduced latency (e.g., compared to traditional techniques and architectures). For example, as will be described in more detail below, the techniques presented herein allow the distributed data buffers to route data within the memory modules without queuing data or scheduling requests. As such, the techniques presented herein substantially reduce the complexity of the data buffer path, which allows data to be routed with reduced latency.

Note that, in the following description, many of the following embodiments use DRAM as a reference example of a type of memory device that can be accessed using the techniques presented herein. Note, however, that the techniques presented herein can also be applied to other types of memory devices, including, e.g., different types of volatile and/or non-volatile memory devices. Further, many of the following embodiments use DIMMs as a reference example of a type of memory module that can be included within memory systems. However, one of ordinary skill in the art will recognize that the techniques presented herein can also be applied to other types of memory modules.

Figure 1:
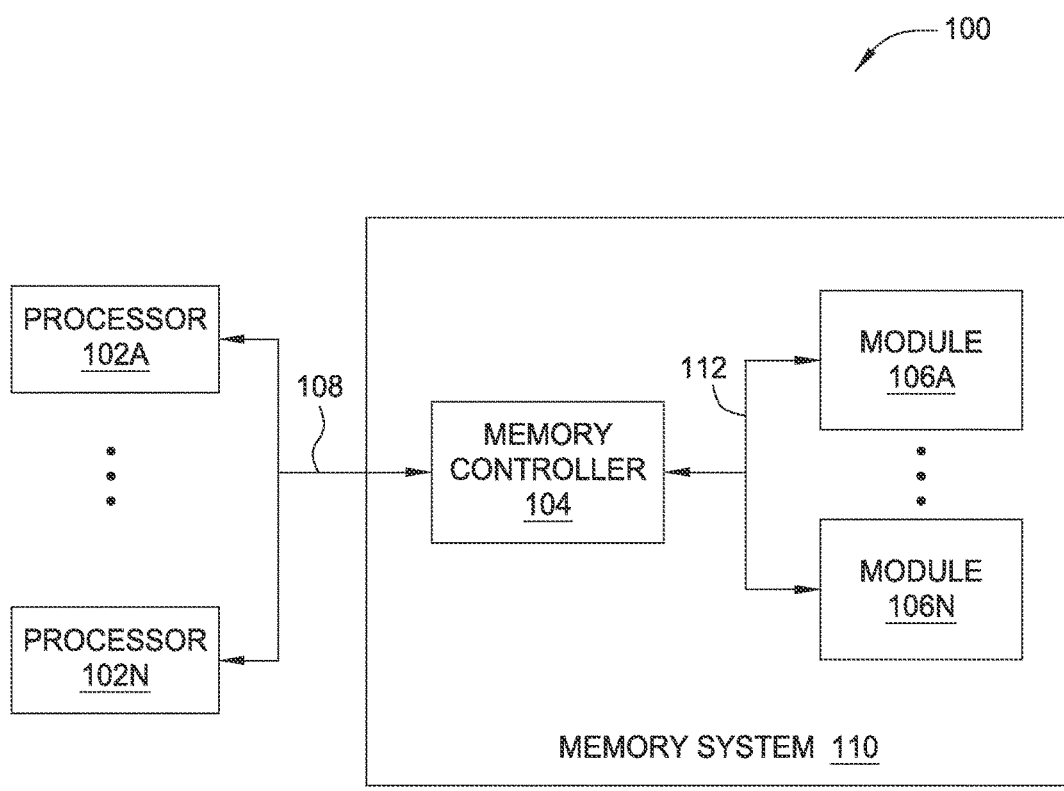
FIG. 1 illustrates an example computer system, according to one embodiment.

FIG. 1 illustrates a computer system 100 according to one embodiment. The computer system 100, in general, can be a part of a desktop computer, laptop computer, mobile device, tablet computer, server computer, personal digital assistant (PDA), and the like. As shown, the computer system 100 includes a plurality of processors 102A-102N coupled to a memory system 110 via system bus 108. The processors 102A-102N may represent one or more processors (e.g., microprocessors, central processing units (CPUs), etc.) or multi-core processors. The processors 102A-102N can also include one or more levels of cache memory.

The memory system 110 includes a memory controller 104 coupled to the plurality of processors 102A-102N via system bus 108 and a plurality of memory modules 106A-106N coupled to the memory controller 104 via system bus 112. The memory system 110 can include one or more different types of memory, such as non-volatile and volatile memory. Volatile memory types can include static random access memory (SRAM), pseudo static random access memory (PSRAM), dynamic random access memory (DRAM), etc. DRAM types can include single data rate (SDR) DRAM, DDR DRAM, low power (LP) DDR DRAM, etc. Non-volatile memory types can include magnetic RAM (MRAM), flash memory, resistive RAM (RRAM), ferroelectric RAM (FRAM), phase-change RAM (PRAM), electrically erasable programmable read-only memory (EEPROM), and the like.

The memory controller 104 is generally configured to manage the flow of data to and from the memory modules 106A-106N and one or more other devices of memory system 110. For example, memory controller 104 is configured to receive one or more commands (e.g., such as read commands, write commands, etc.) from one or more of the processors 102A-102N. In response to receiving the commands, the memory controller 104 is configured to perform a read or write access to memory devices within modules 106A-106N. Note, while memory controller 104 is shown within memory system 110, in other embodiments, the memory controller 104 can be integrated with another device, e.g., such as any one of processors 102A-102N.

In one embodiment, data can be exchanged between the devices in the computer system 100 via system buses 108 and 112. Buses 108 and 112 may include a plurality of parallel conductive lines for transferring one or more bits of data. For example, in one embodiment, the buses 108 and/or 112 may include a control bus, an address bus, and/or a data bus. A control bus can be used to exchange control signals, examples of which include, but are not limited to, write enable, chip select, data available, and the like. An address bus can be configured to transfer an address representing a memory location for storing or retrieving data. A data bus can be configured to transfer data to and from identified memory locations. In one embodiment, one or more conductive lines of buses 108 and/or 112 can be configured to transfer control bits, address bits, and/or data bits.

In one embodiment, the computer system 100 is a synchronous system. For example, the computer system 100 may also include a clock (not shown) for generating a clock signal for the memory devices within the memory modules 106A-N. The devices may transfer and/or receive data from the bus 112 at a clock edge of the clock signal or another signal derived from the clock signal. In one embodiment, the computer system 100 may implement DDR to achieve higher data access rates, compared to other traditional systems. When implementing DDR, the system buses 108/112 transfer data on both the rising and falling edges of a clock signal. For example, the arrival of the rising edge of the clock signal at a memory device within one of the modules 106A-106N causes the memory controller 104 to sample the address and control lines. The state of the address and control lines controls both the operation of the memory devices and the datum to be operated on. Similarly, both the rising and falling edges of bidirectional differential data strobes are used on a write to capture the state of the datum on the memory devices. On a read, the data strobes are toggled co-incident with the changing the state of the data bus, which runs at twice the speed of the clock.

For traditional memory systems that include sets of DRAM devices in parallel, all devices to be accessed for a particular data transfer are generally co-located on a memory DIMM (e.g., such as a registered DIMM (RDIMM)). For SDRAM DDR4, the JEDEC standard allows for up to 3.2 Gb/s data rate, or a corresponding 1.6 Gb/s address rate, which is generally so fast that many computer systems utilized address registering. The address register (sometimes called an address buffer) is located on the DIMM, typically centered among the DRAM devices. The address register intercepts the address bus from the processor, creates one or more copies of the address bus, and on the next clock cycle, sends the address to the memory devices. In a typical two rank RDIMM, eighteen DRAMs each contribute 1 byte of data. The DIMM has single ended data lines for 8 bytes of data plus 1 byte of error correction code (ECC) data, for a total of 72 data lines including, clock, data strobe, address and control, and other control or identification bits. The eighteen DRAM devices in a RDIMM are typically organized into 2 ranks. On a read or write, both ranks are signaled by a single rank select line that dictates which rank of devices is being accessed, as the two ranks share the data lines.

In some cases, multiple DIMMs can share the address and/or data bus from the processor. However, in these situations, the cycle time can be affected since every device on a common bus generally slows the rise and fall time of the signal, as well as its propagation velocity. Generally, if more than two DRAMs on each of two DIMMs share a data bus, then in addition to address registers, data registers (sometimes called a data buffer) can be used as well (e.g., such as in a load-reduced DIMM (LR-DIMM)). As opposed to the address buffer, which is centrally located on the memory DIMM above the address/control pins at the DIMM card edge, the data buffers (typically 9 byte-wide) are distributed along the bottom card edge of a LR-DIMM, just above the data contacts. Similar to the address buffers, the data buffers accept the single ended data and differential strobes from the processor of a read, and on the next clock edge, drive a copy of the signals to one or more DRAM devices sharing a common data bus. For a write, the data buffers perform a reverse operation.

Traditional memory modules (e.g., RDIMMs, LR-DIMMs, etc.) were developed out of the desire to keep a simple DRAM, but are typically used in systems that run many DRAMs at a high data rate. These memory modules allowed memory systems to incorporate multiple DRAM devices, but at the cost of providing address and data busses, one for each independent 8 byte data bus, from the processor. In these systems, the address and data busses can limit the peak data bandwidth of the processor. For example, for DDR memory, such configuration can limited the peak data bandwidth of the processor to, e.g., 3.2 GB/s×8 bytes×N, where N is the number of independent sets of data busses. To address this problem, some memory systems re-drive both DRAM address and data using a combined address and data buffer to interface with the processor. For example, such systems typically use a unidirectional, byte wide, differential address and write data connection from the processor to the combined buffer, and a two byte wide, read data bus back to the processor.

As the demand for faster memory continues to increase, these traditional architectures for memory modules and/or traditional methods for accessing memory may not be capable of meeting the higher data speeds. For example, using the evolution of DDR memory as an example, each generation of DDR memory generally has doubled the speed of the previous generation. However, in order for traditional architectures to be able to operate at higher speeds (e.g., up to 6.4 Gb/s for DDR generation 5, etc.), these traditional architectures would have to place some limitations in the data bus. For example, even in cases where a two rank DIMM would to be placed immediately adjacent to the processor, with only 1 DIMM allowed for the bus, the bus may still be too long to allow operation at full speed. Thus, in order to achieve increase bandwidth using the same number of DIMMs, a memory system would typically have to increase the number of memory busses from the processor, which is not practical.

In addition, even in modules that use a combined data/command buffer, the shared data lines may be too long to run at full speed, in part, due to the distances between the central buffer and the memory devices. These central buffers are typically associated with huge chip package sizes, and thus tend to consume a lot of power. Further, the data processing latency is generally very long (e.g., especially in cascaded cases), due to the huge chip size and complexity associated with such buffers. As such, it may be desirable to provide an increase in memory bandwidth without changing the inherent architecture of a memory module and/or memory system.

Embodiments presented herein describe a scalable, distributed data buffer for a memory module, which allows conventional DDR memory to continue its evolution. As described in more detail below, the techniques presented herein allow the distributed data buffers to route data within the memory modules without queuing the data or scheduling requests, which significantly reduces the complexity of the data buffer path and allows memory to be accessed with reduced latency (compared to traditional methods).

Note that computer system 100 illustrates merely one example of a computer system that can be used to implement one or more of the techniques presented herein. For example, the computer system 100 may include a motherboard, central processor, memory controller, memory, hard drive, graphics processor, peripherals, and other devices which may be found in a computer system. More generally, one of ordinary skill in the art will recognize that other embodiments of computer systems can also be configured to implement the techniques presented herein.

Figure 2:
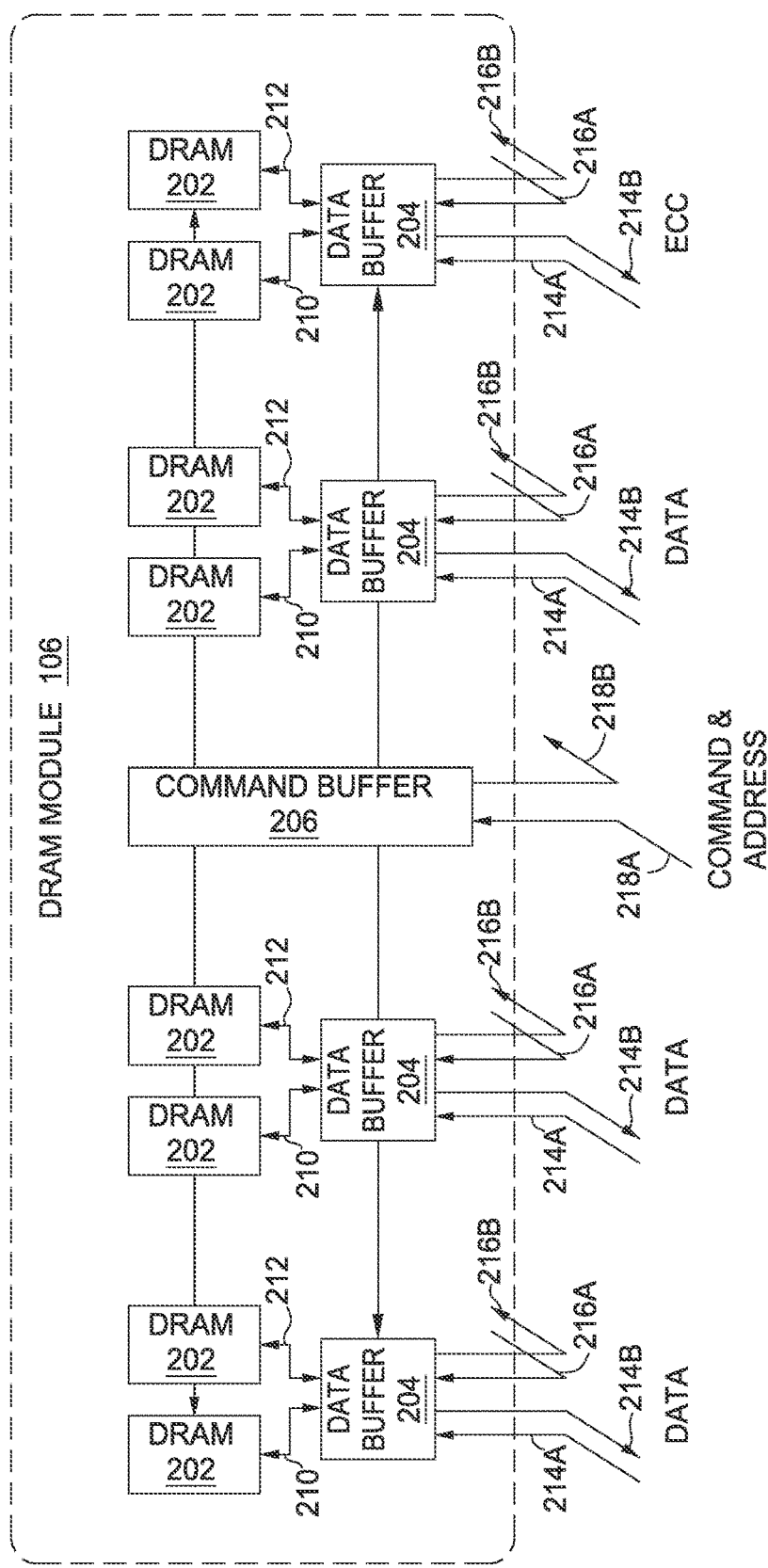
FIG. 2 illustrates an example of a memory module within a computer system, according to one embodiment.

FIG. 2 further illustrates an example of the memory module 106 within the memory system 110 described relative to FIG. 1, according to one embodiment. As shown, the memory module 106 includes a command buffer 206, a plurality of distributed data buffers 204 and a plurality of DRAMs (memory devices) 202. In one embodiment, the memory module 106 includes nine distributed data buffers 204, with each data buffer 204 coupled to two DRAMs 202. The processors 102 and memory controller 104 are configured to access data from the plurality of the DRAMs 202 organized into ranks. For example, in this embodiment, the DRAMs 202 are organized into ranks of two (e.g., with each data buffer 204 coupled to two DRAMs 202). The access can include a read (fetch) or a write (store) of a cache line, typically 64 or 128 bytes. The cache lines are located at an address that consists of a plurality of bits, which describes the location of the line in memory.

The command buffer 206 is configured to receive one or more sets of command and address signals for controlling the DRAMs 202 and data buffers 204. In one embodiment, the signals can come from the processor (or memory controller). In another embodiment, the signals can come from another command buffer of a memory module. Examples of the command and address signals can include chip select (/CS), row address strobe (/RAS), column address strobe (/CAS), write enable (/WE), bank selection, clock signals, addressing commands, and the like. /CS signals are generally used to select a rank of memory devices to be accessed during a read or write operation. /RAS and /CAS signals can be used to latch a row address and column address, respectively, and to initiate a read or write operation. /WE signals can be used to distinguish between read or write commands. The /RAS, /CAS and /WE signals can be used to select one or more memory commands, e.g., such as read, write, activate, pre-charge, refresh, load mode register, and the like. Once the command buffer 206 receives the signals, the command buffer 206 is configured to re-drive one or more of the signals to the DRAMs 202 and data buffers 204.

Each data buffer 204 is coupled to one or more lanes of a data bus. The one or more lanes can be used to transfer one or more data and ECC bits in both downstream and upstream directions. For example, as shown, the first three data buffers 204 can transfer one or more data bits over the lanes coupled to the respective data buffers, and the last data buffer 204 can transfer one or more ECC bits over the lanes coupled to the last data buffer. Each data buffer 204 can transfer bits, via the data bus, to a processor or either another data buffer on another module. For example, for a write operation, once one of the data buffers 204 receives one or more lanes of data, ECC, etc. (e.g., from a processor, another data buffer on an upstream memory module, etc.), the data buffer 204 can re-drive the data lanes and/or ECC to DRAM devices attached to the data buffer or to another cascaded (or daisy-chained) memory module. Similarly, for a read operation, once one of the data buffers 204 receives data from one of the DRAM devices (or from another downstream memory module), the data buffer 204 can re-drive the data to the processor or another upstream memory module.

In one embodiment, each data buffer 204 includes a multi-ported bidirectional bus interface between the data buffer 204 and one or more DRAM devices 202. For example, as shown, each data buffer 204 is coupled, via one port, to a bidirectional bus 210, and is coupled, via another port, to a bidirectional bus 212. In one embodiment, each data buffer 204 also includes a unidirectional bus interface between the respective data buffer and the host (e.g., memory controller or processor). In one embodiment, the host bus includes a primary port and a secondary port, in both upstream and downstream directions, for cascading or scalability. For example, as shown, each data buffer is coupled to a primary unidirectional bus 214A in an upstream direction, a primary unidirectional bus 214B in a downstream direction, a secondary unidirectional bus 216A in an upstream direction, and a secondary unidirectional bus 216B in a downstream direction.

In one embodiment, each data buffer 204 is configured to route data to and/or from the DRAM devices 202 via the unidirectional buses 214 and 216. Using one of the data buffers 204 as a reference example, the data buffer 204 can receive data to be written to one of the DRAM devices 202 via the bus 214A. This data could come from the memory controller (or processor) if data buffer 204 were on a memory module adjacent to the processor, or could be from another data buffer on an upstream memory module (e.g., if data buffer 204 were on a cascaded (or downstream memory module)). Once received, the data buffer 204 could route the data to the one of the DRAMs 202, or could route the data to another (data buffer) on a downstream memory module via bus 216B. In one embodiment, during a read operation, the data buffer 204 can receive data from one of DRAMs 202 or from another downstream memory module via bus 216A. Once received, the data buffer 204 could route the data to the processor or to another memory module via bus 214B.

In one embodiment, the command buffer 206 is configured to receive one or more control bits, address bits, clock, etc., from a processor or another command buffer of an upstream memory module via the bus 218A. The command buffer 206 is also configured to route one or more control bits, address bits, clock, etc., to another command buffer of another memory module via bus 218B. In another embodiment, instead of routing command and address signals to another cascaded memory module, the host command bus to each memory module may just be dotted (i.e., each command buffer can touch/share the signals on the command bus).

Note that FIG. 2 illustrates merely one example of a memory module that can use distributed data buffers to route data according to the techniques presented herein. For example, although four data buffers are shown in FIG. 2, those of ordinary skill in the art will understand that any number of data buffers can be distributed within the memory module. Further, although each data buffer is shown coupled to two DRAMs, in other embodiments, the data buffer could be coupled to fewer or greater number of DRAMs. For example, in one embodiment, the memory module could include a plurality of data buffers, with each data buffer coupled to one DRAM. In one embodiment, the memory module could include a plurality of data buffers, with each data buffer coupled to four DRAMs.

Figure 3:
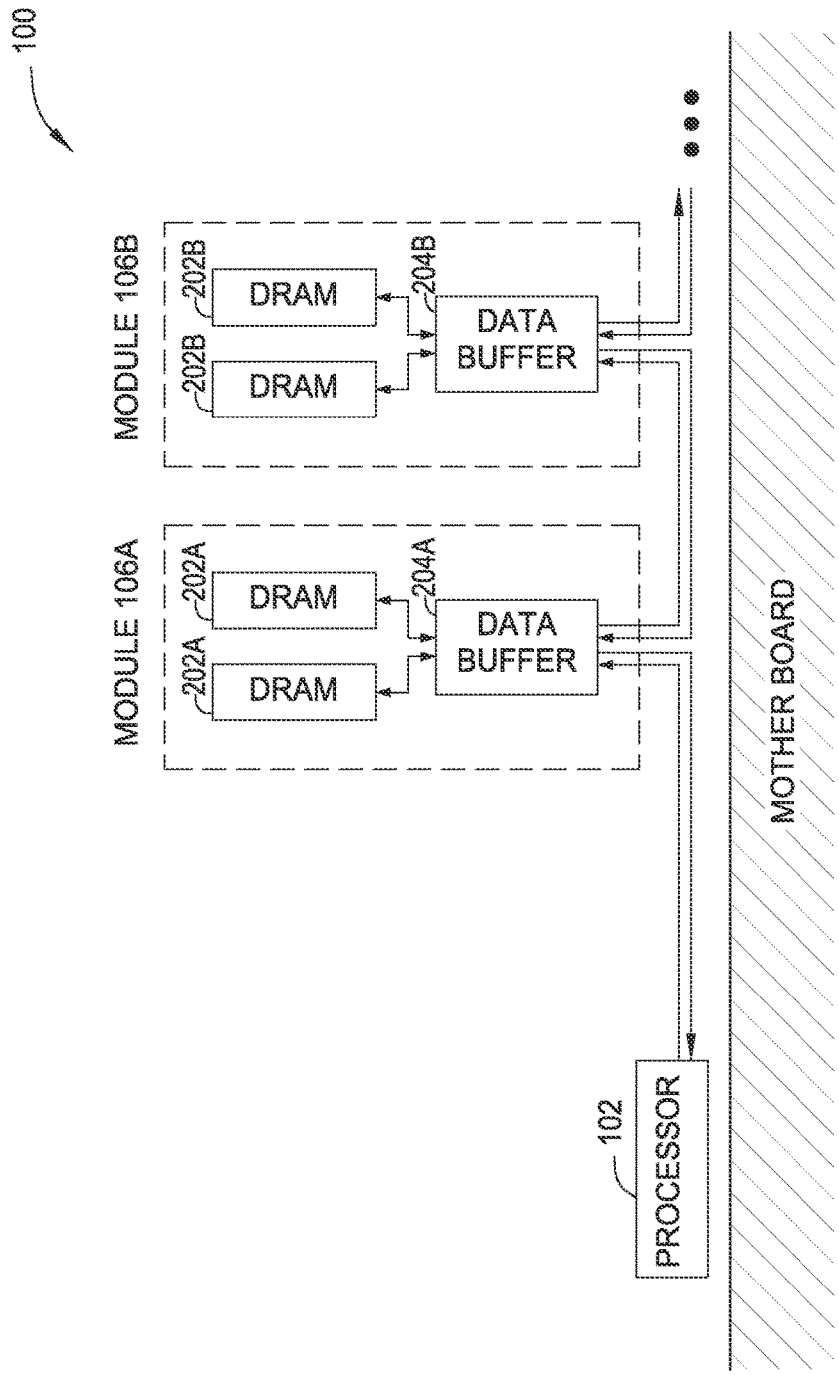
FIG. 3 illustrates an example of memory modules cascaded via a data buffer, according to one embodiment.

FIG. 3 illustrates two or more memory modules, within a computer system 100, cascaded via a data buffer, according to one embodiment. As shown, the computer system 100 includes processor 102, and at least two cascaded memory modules 106A and 106B. Note, for the sake of clarity, each module 106 is shown with one data buffer 204 coupled to two DRAMs 202. However, one of ordinary skill in the art will understand that any number of data buffers 204 and/or DRAMs 202 can be included within a memory module.

As shown, the processor 102 is directly coupled to module 106A, and is configured to access DRAMs 202A via the data buffer 204A. In one embodiment, the processor 102 can use data buffer 204A and 204B to access DRAMs 202B on module 106B. For example, as described below, the data buffer 204A is configured to route data, e.g., on a write operation, from the processor 102 to the data buffer 204B, in order to access DRAMs 202B. Similarly, on a read operation, the data buffer 204A can receive data from DRAMs 202B, via data buffer 204B, and return the data to processor 102.

As used herein, the memory module 106A may be referred to as a downstream memory module (relative to processor 102), and as an upstream memory module (relative to memory module 106B). Similarly, the memory module 106B may be referred to as a downstream memory module (relative to processor 102 and memory module 106A), and as an upstream memory module relative to one or more other downstream memory modules (not shown).

Figure 4:
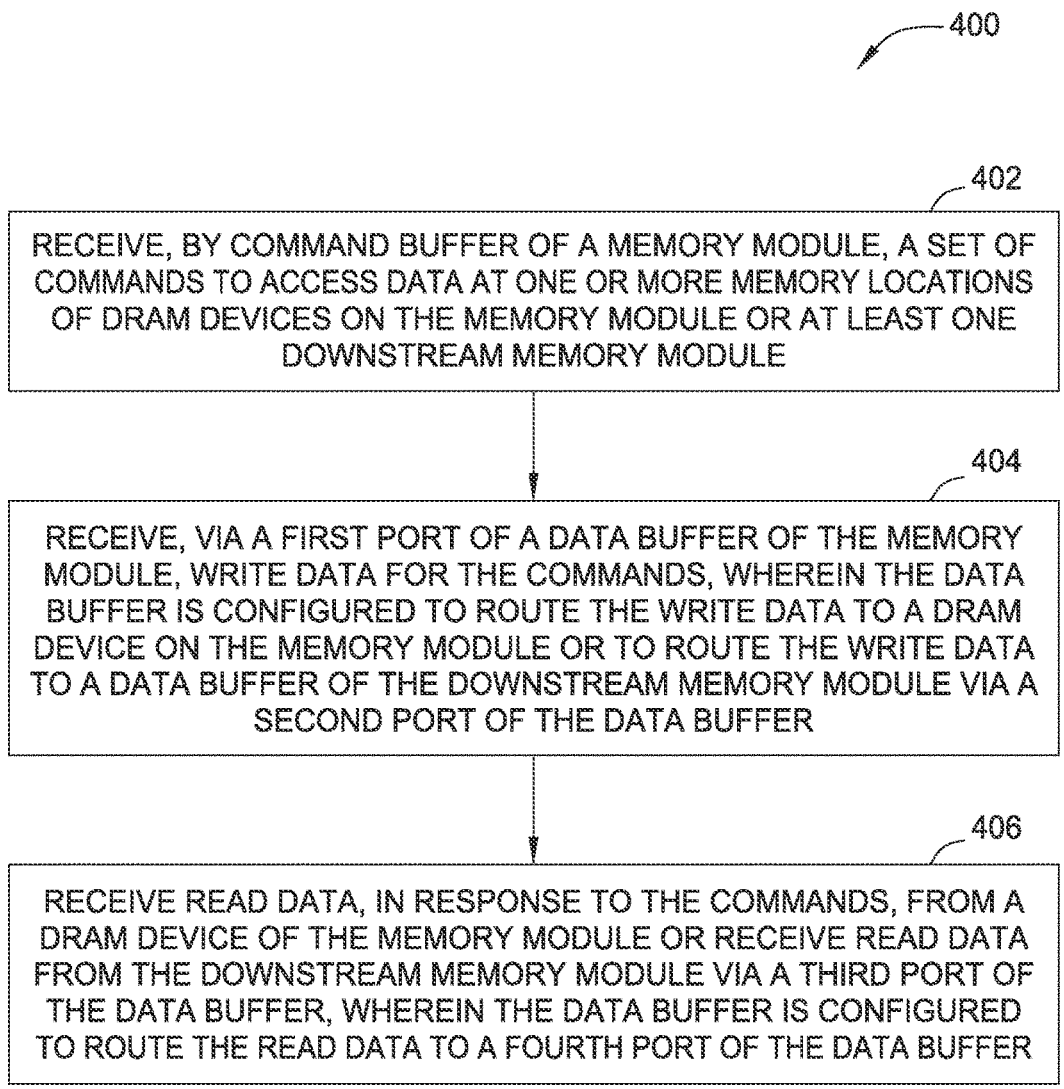
FIG. 4 illustrates a method for routing data by a memory module, according to one embodiment.

FIG. 4 illustrates a method 400 for routing data by a memory module, according to one embodiment. As shown, the method 400 begins at step 402, where the memory module receives, by a command buffer of the memory module, a set of commands to access data at one or more memory locations of DRAM devices on the memory module or at least one downstream memory module.

At step 404, the memory module receives, via a first port of a data buffer of the memory module, write data for the commands. In one embodiment, the data buffer is configured to route the write data to a DRAM device on the memory module. In one embodiment, the data buffer is configured to route the write data to a data buffer of the downstream memory module via a second port of the data buffer.

At step 406, the memory module receives read data, in response to the commands, from a DRAM device of the memory module or receives read data from the downstream memory module via a third port of the data buffer. The data buffer is configured to route the read data to a fourth port of the data buffer.

Figure 5:
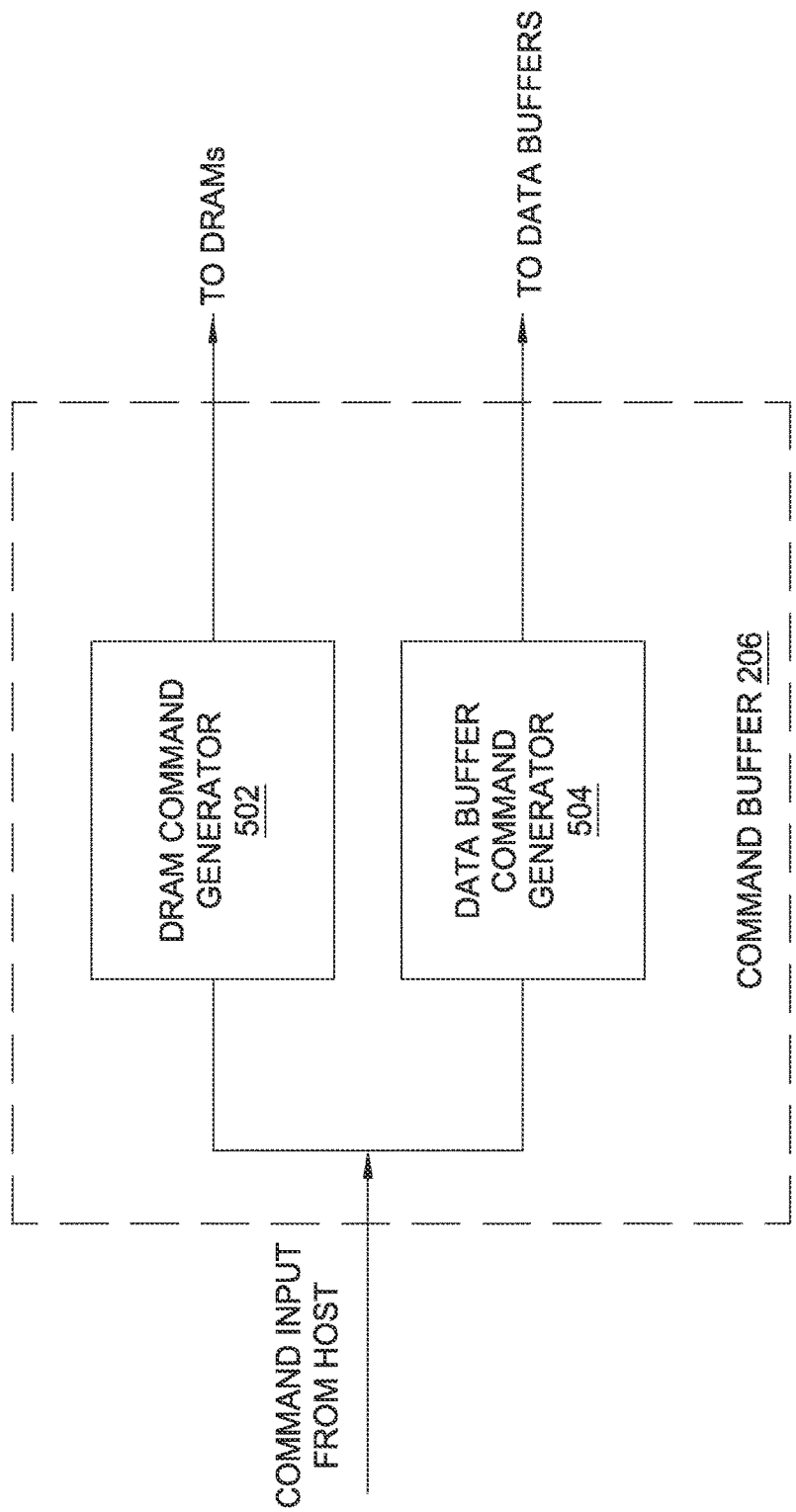
FIG. 5 illustrates an example of a command buffer within a memory module, according to one embodiment.

FIG. 5 further illustrates an example of the command buffer 206, described relative to FIG. 2, according to one embodiment. As shown, the command buffer 206 includes a DRAM command generator 502 and a data buffer command generator 504. In one embodiment, the command buffer 206 is configured to receive one or more command inputs for accessing one or more DRAM devices. As mentioned above, these commands can include commands for read operations, write operations, or one or more special operations (e.g., activate, pre-charge, refresh, hold register set, power up/down, etc.). The command input can also include clock signals and address commands (e.g., row address, column address, bank address signals, etc.).

In one embodiment, the command buffer 206 of each memory module can receive the command input directly from the processor or memory controller (e.g., in cases where the command buffer to each module shares the same command bus to the processor). In one embodiment, the command buffer 206 can be cascaded command buffer. In such cases, the command buffer can receive the command input (transmitted via the processor) via one or more cascaded command buffers of one or more cascaded memory modules.

In one embodiment, once the command buffer 206 receives a command input, the command buffer is configured to generate one or more sets of commands, via the DRAM command generator 502 and the data buffer command generator 504. Using a read operation as a reference example, the command buffer 206 can receive a command to read a particular address (or memory location of a DRAM device). Once received, the DRAM command generator 502 can forward the read command to the particular DRAM device. In some cases, the DRAM command generator 502 is configured to apply to forward the read command at the correct control signal timing for the particular DRAM.

In one embodiment, the data buffer command generator 504 is configured to convert the command input (e.g., read command) to a format or context that allows the data buffer to understand when and how to route data that is transferred in response to the command input (or DRAM commands). For example, in some cases, the data buffers may not need the particular address (or memory location) of the DRAM device, or the particular DRAM operations associated with the received command input. Accordingly, in some embodiments, the data buffer command generator 504 is configured to generate a reduced set of commands for the data buffers, relative to the set of commands generated by the DRAM command generator 502. For example, in some cases, the reduced set of commands may include a command for whether the operation is a read or write, and the destination of the command (e.g., which memory module and which DRAM port). In some cases, the reduced set of commands may also include a power up/down command. Further, in some embodiments, the reduced set of commands for the data buffers may occupy fewer lanes than the lanes used for the DRAM commands.

In one embodiment, the data buffer command generator 504 may generate the reduced set of commands by deleting (or dropping) at least some information from the command input. For example, as mentioned above, the data buffer command generator 504 can drop commands associated with special memory operations (e.g., such as pre-charge, refresh, etc.) and addresses associated with the commands (e.g., the particular memory locations of the DRAM devices to be accessed).

In one embodiment, the data buffer command generator 504 can also apply a time delay to the generated commands for the data buffers (e.g., by delaying the forwarding of the command for a fixed number of cycles). Such time delay may be generated to account for a time delay in routing the read data and write data through the data buffers. For example, in general, there may be some delay between when the DRAM command received at the DRAMs and the transfer of data from and/or to the DRAMs. In these situations, to make sure the data buffers apply the switching and routing of the data at the appropriate time, the data buffer command generator 504 may incorporate the time delay when it converts the command input into one or more data buffer commands.

Figure 6A:
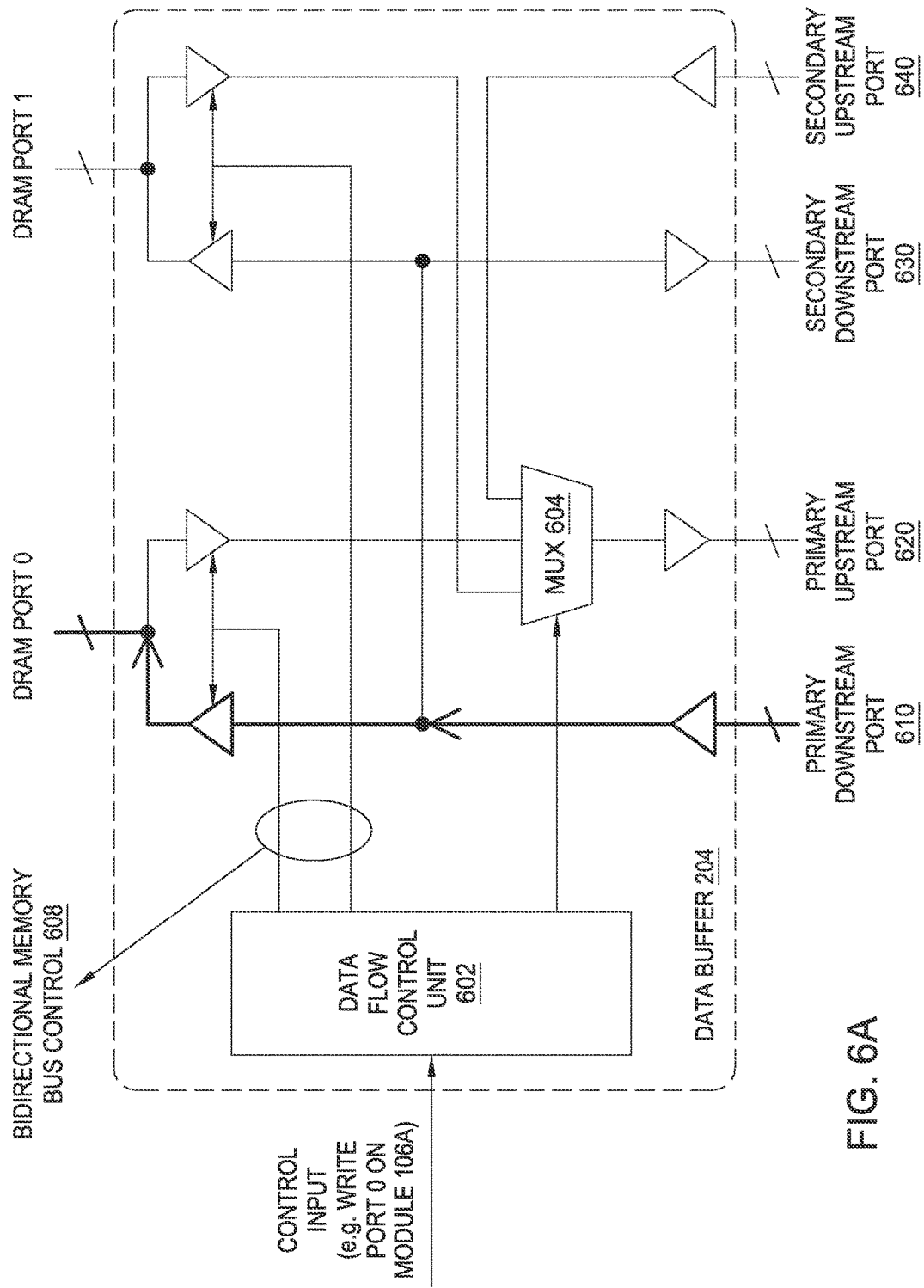
FIGS. 6A-6C illustrate a data buffer configured to route read data, according to various embodiments.
Figure 6B:
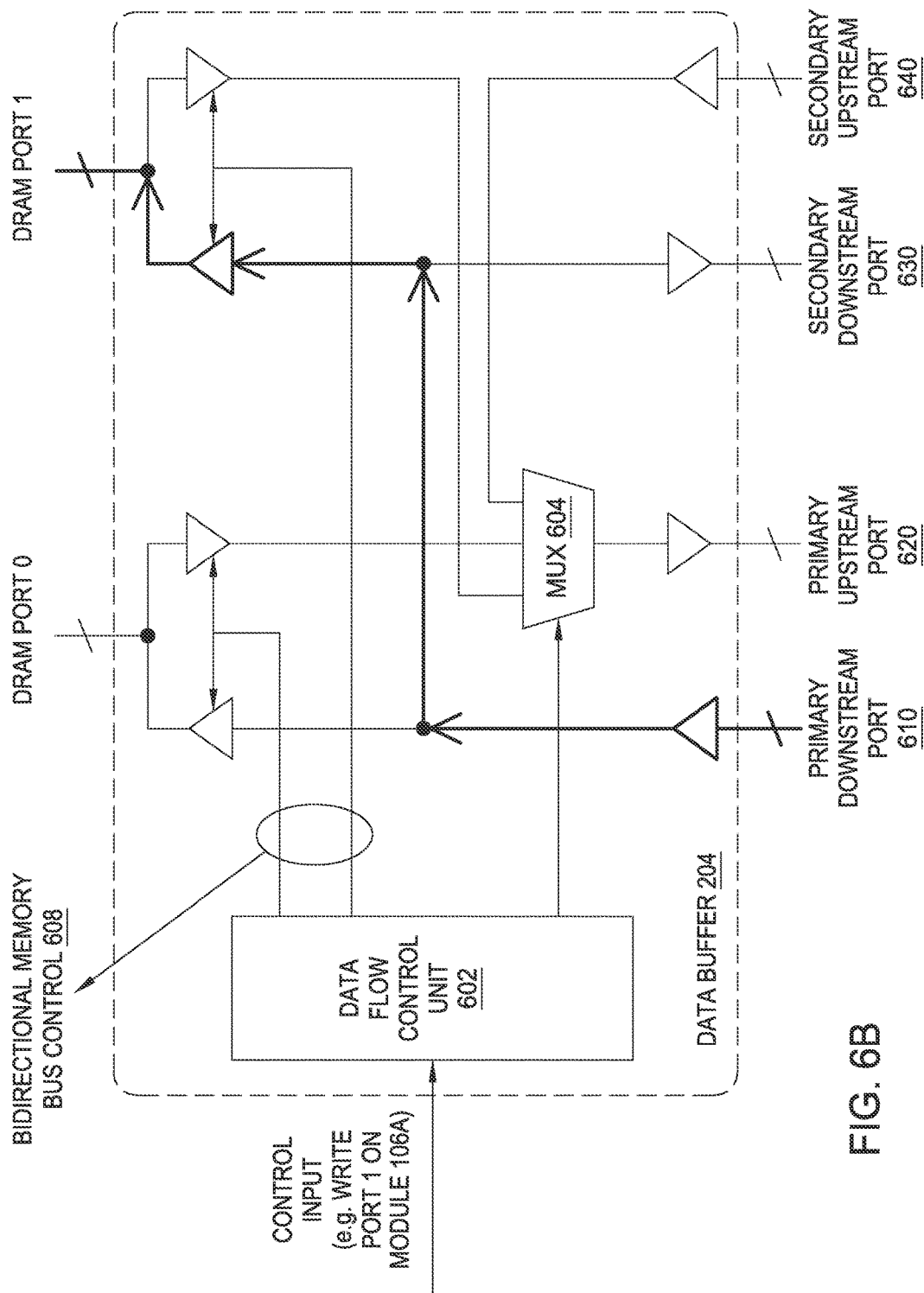
Figure 6C:
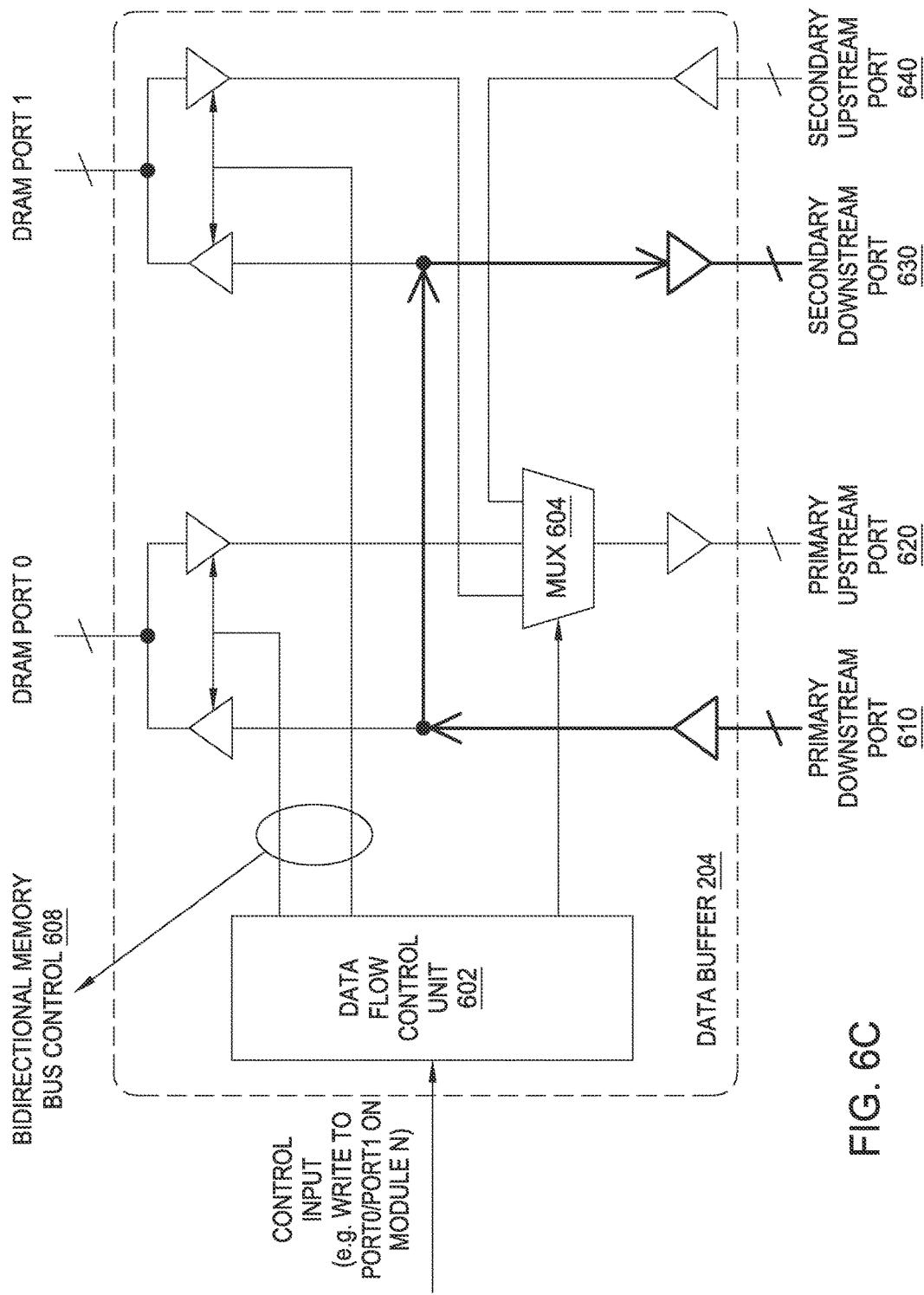
Figure 7A:
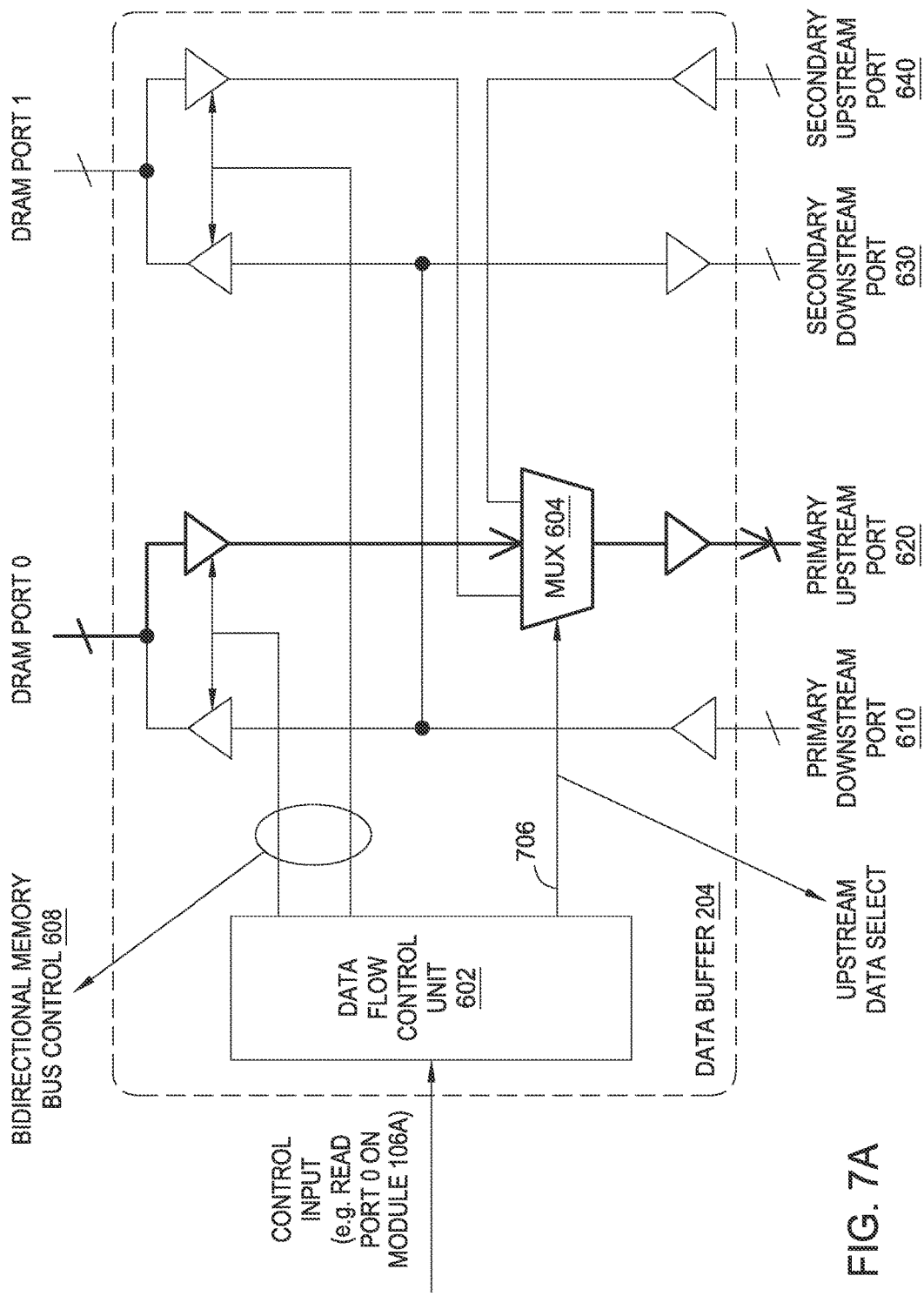
FIGS. 7A-7C illustrate a data buffer configured to route write data, according to various embodiments.
Figure 7B:
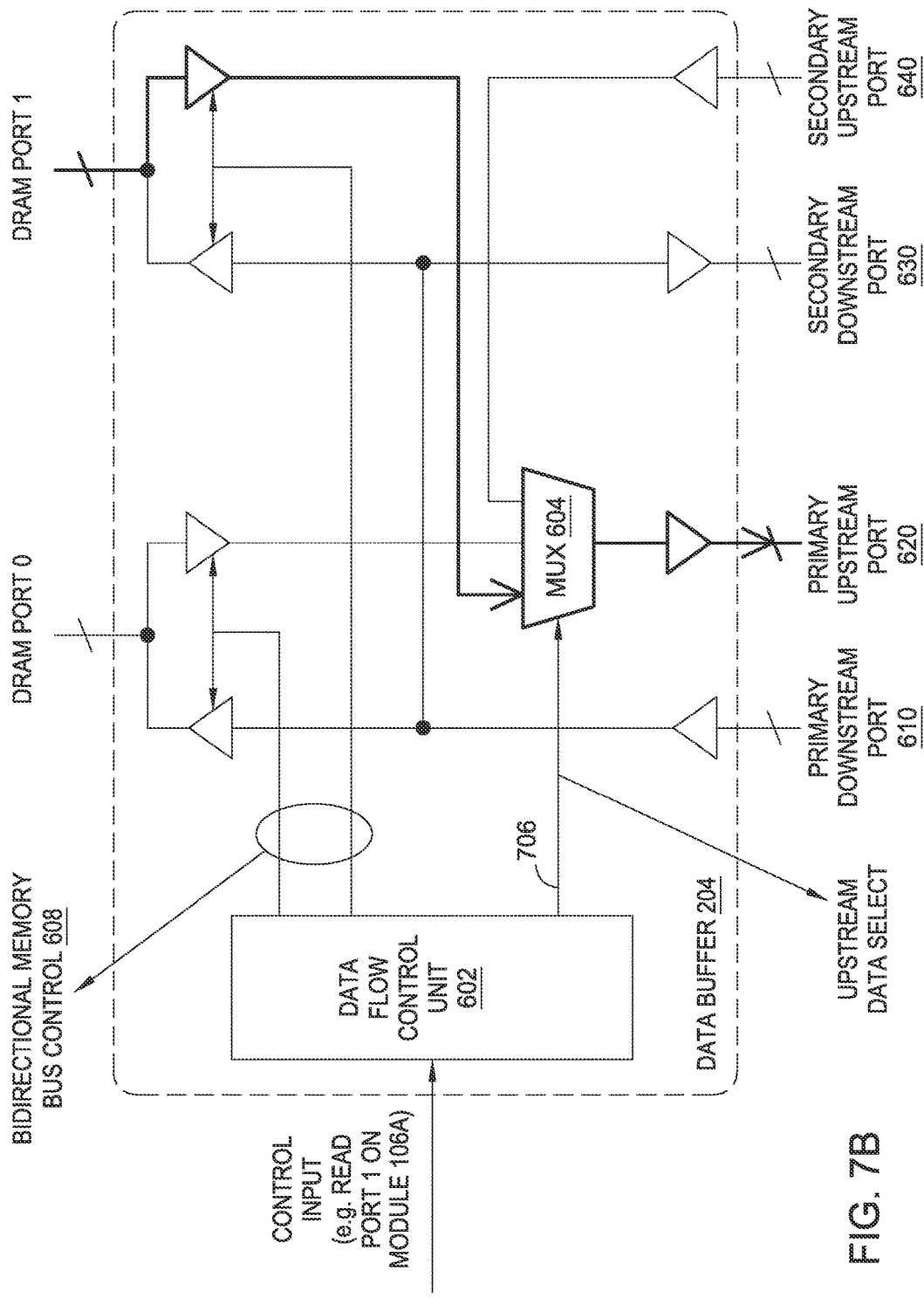
Figure 7C:
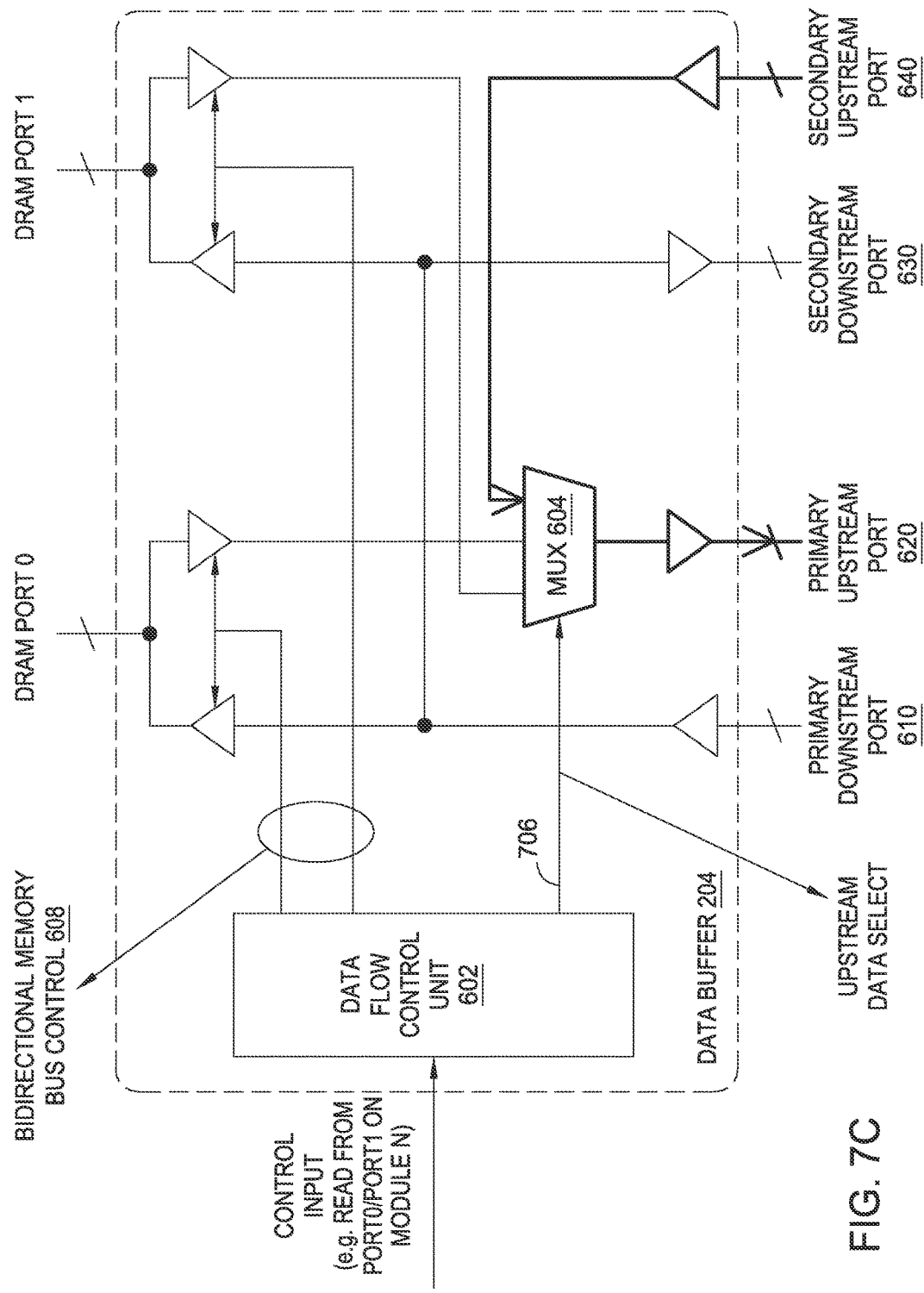

FIGS. 6A-6C and 7A-7C further illustrate an example of the data buffer 206, described relative to FIG. 2, according to one embodiment. In particular, FIGS. 6A-6C illustrate examples of the data buffer 206 routing data in response to write commands, and FIGS. 7A-7C illustrate examples of the data buffer routing data in response to read commands.

Referring first to FIG. 6A, as shown, the data buffer 204 includes a data flow control unit 602, a multiplexer (MUX) 604, a bidirectional memory bus control 608, two bidirectional DRAM ports, and four unidirectional ports. The bidirectional DRAM ports include DRAM port 0 (DP0) and DRAM port 1 (DP1). The unidirectional ports include primary downstream port 610, primary upstream port 620, secondary downstream port 630, and secondary upstream port 640. The data buffer 204 of FIG. 6A can be a data buffer of an adjacent memory module to the processor, or a downstream (cascaded) memory module. For example, ports 610 and 630 can be configured to receive one or more data lines from a processor or another upstream memory module. Further, ports 620 and 640 can be configured to receive one or more data lines from a downstream memory module or from DRAMs on the same memory module, and route the data to a processor or another upstream memory module.

In one embodiment, the data flow control unit 602 is configured to receive a control input (e.g., set of data buffer commands) from the command buffer. For example, as shown in FIG. 6A, such a command can include a command to write to DRAM device at port 0 on the same memory module (e.g., module 106A). Once received, the data flow control unit 602 is configured to control MUX 604 and/or bi-directional memory bus control 608 to control the routing of data (in response to the command) through the data buffer 204. For example, the data flow control unit 602 can use bidirectional memory bus control 608 to control the direction of bidirectional ports DP0 and DP1. In some embodiments, the bidirectional memory bus control 608 can use a multiplexer to control the direction of DP0 and DP1 (e.g., by tri-stating the multiplexer). As mentioned above, in some cases, the data buffer can be configured to know when to switch directions of the bidirectional memory buses and/or or control switching of the MUX 604 based on a timing delay incorporated into the received control input from the command buffer. In some embodiments, the data flow control unit 602 is also configured to implement a timing delay between the received control input and the subsequent controlling of the routing of data within the data buffer 204.

As shown in FIG. 6A, in response to a write command to write to a DRAM device via port 0 on the same memory module, the data buffer 204 is configured to (subsequently) receive write data for the write commands via port 610. Such data can be received directly from a memory controller, or indirectly (e.g., via another upstream memory module) from the memory controller. Once the write data is received, the data buffer 204 is configured to route the write data to a DRAM device via DP0, using memory bus control 608. As shown in FIG. 6B, in response to a write command to write to a DRAM device via port 1 on the same memory module, the data buffer 204 is configured to route the write data (received via port 610) to a DRAM device via DP1, using memory bus control 608. FIG. 6C illustrates an example of the data buffer 204 routing data to another memory module in response to receiving a command to route data to a DRAM device at one of DP0 or DP1 on a downstream memory module (e.g., memory module 106B). As shown, once the data buffer 204 receives the write data, via port 610, the data buffer routes the data to a DRAM device via the secondary downstream port 630, e.g., instead of writing to DRAM devices via DP0 and/or DP1 on the same memory module.

As mentioned above, the data buffer 204 is also configured to route read data, in response to read commands. The data buffer 204 is configured to control the routing of read data in response to the commands using memory bus control 608 and upstream data select signal 706. For example, as shown in FIG. 7A, the data buffer 204 is configured to receive a command to read the DRAM device at port 0 on the same memory module. In response to the command, the data buffer 204 routes read data received from a DRAM device via DP0 to the port 620 via the MUX 604. As shown, the data buffer 204 is configured to switch the MUX 604 to the DRAM port 0 based on an upstream data select signal 706, which may be a single-bit or multi-bit signal. As shown in FIG. 7B, in response to receiving a command to read a DRAM device via DP1 on the same memory module, the data buffer 204 is configured to route read data received from a DRAM device via DP1 to the port 620 via the MUX 604, using upstream data select signal 706. As shown in FIG. 7C, in response to receiving a command to read a DRAM device on another memory module, the data buffer 204 is configured to use upstream data select signal 706 to select secondary upstream port 640 in order to route read data received via port 640 from a downstream memory module to an upstream memory module (or processor) via port 620.

Doing so in this manner allows the data buffer 204 to re-direct data (e.g., by switching the MUX control through external command lines, etc.) without data going through long internal FIFOs or queues (generally associated with traditional architectures), which reduces the overall latency associated with accessing memory devices in cascaded memory modules. Note that the data buffer illustrated in FIGS. 6A-6C and 7A-7C is merely one example of a data buffer that can be configured to implement the techniques presented herein. For example, in some embodiments, instead of two DRAM ports, the data buffer could have one DRAM port. In this case, the MUX would be a 2 to 1 MUX (instead of a 3 to 1 MUX). In some embodiments, the data buffer could have 3 DRAM ports (e.g., and use a 4 to 1 MUX), or could have 4 DRAM ports (e.g., and use a 5 to 1 MUX).

In some cases, DP0 and DP1 may operate at a data rate that is different from primary ports 610, 620 and secondary ports 630, 640 in order to cascade one or more memory modules via the primary and/or secondary ports. For example, in some cases, the data rate of the primary and/or secondary ports may operate at a much higher speed (and have a narrower lane width interface) compared to the data rate (and lane widths) of DP0 and DP1 in order to accommodate the number of pins associated with daisy-chaining. In one case, for example, if DP0 or DP1 is 8 bit wide running at 4 GB/s, the primary port and/or secondary port may each have 1 line and operate at 8× higher speed (e.g., compared to operating speed of DP0 and DP1). In another case, if one of DP0 or DP1 is 8 bit wide running at 4 GB/s, the primary port and/or secondary ports may each be 4 bit wide and operate at 4× higher speed compared to DP0 and DP1. In these cases, the data buffer 204, in some embodiments, may deserialize data received into the data buffer and serialize data output the data buffer 204 to account for the differences in data rates.

Figure 8A:
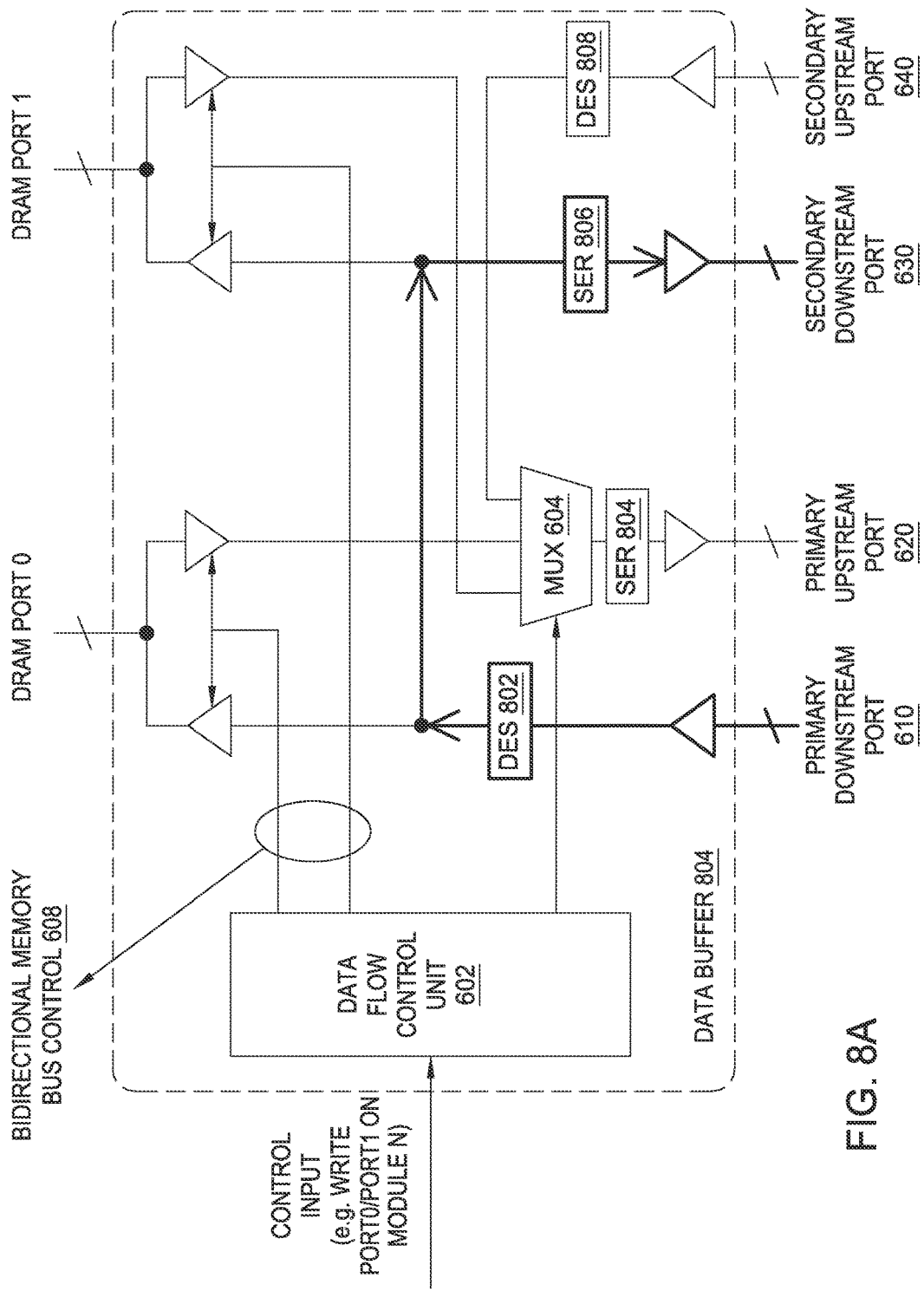
FIGS. 8A-8B illustrate a data buffer configured to deserialize/serialize data from other memory modules, according to various embodiments.
Figure 8B:
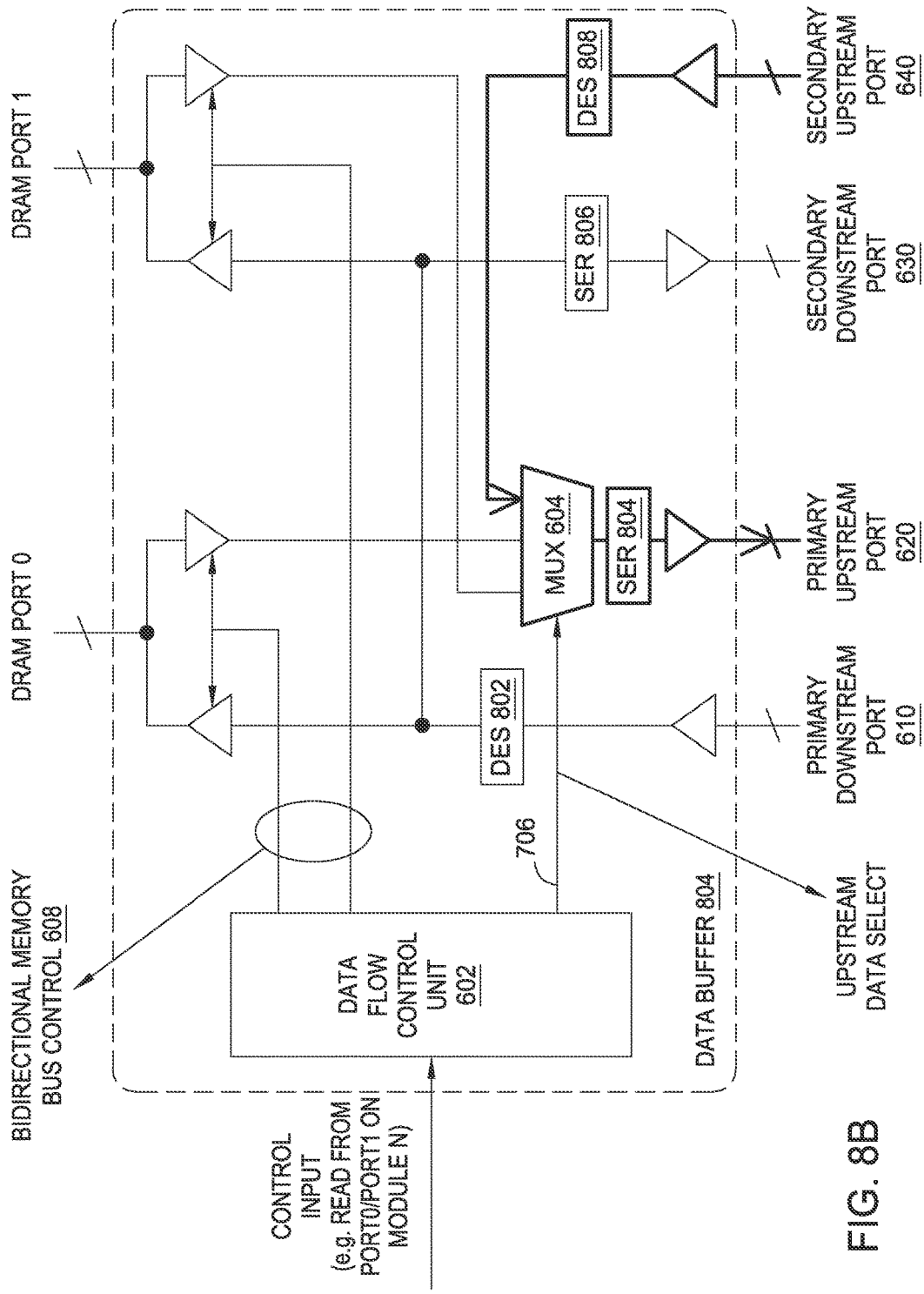

FIGS. 8A-8B illustrate an example of a data buffer 804 incorporating deserializers and serializers, according to one embodiment. Note that many of the components (e.g., data flow control unit 602, MUX 604, ports 610-640, memory bus control 608, etc.) of the data buffer 804 have same or similar functions as their corresponding components described relative to FIGS. 6A-7C. Therefore, for the sake of convenience, these functions (where the same) may not be described again below in the description.

As shown, in this embodiment, compared to the data buffer 204, the data buffer 804 also includes a deserializer (DES) 802, a serializer (SER) 804, a SER 806, and a DES 808. SERs 804 and 806 are generally configured to convert parallel data (e.g., via multiple lines of data bus) into a serial stream. On the other hand, DESs 802 and 808 are generally configured to convert serial data into parallel data for transmission over a plurality of lines.

In one embodiment, the data buffer 804 is configured to deserialize, via DES 802 and DES 808, any data received into the memory module and is configured to serialize, via SER 804 and 806, any data outputted from the memory module. As shown in FIG. 8A, for example, once the data buffer 804 receives a command to write data to another memory module, the data buffer 804 uses DES 802 to deserialize the write data received via port 610 and uses SER 806 to serialize the data output from port 630. As shown in FIG. 8B, once the data buffer 804 receives a command to read data from another memory module, the data buffer 804 uses DES 808 to deserialize the read data received via port 640 and uses SER 804 to serialize the data output from port 620.

Figure 9A:
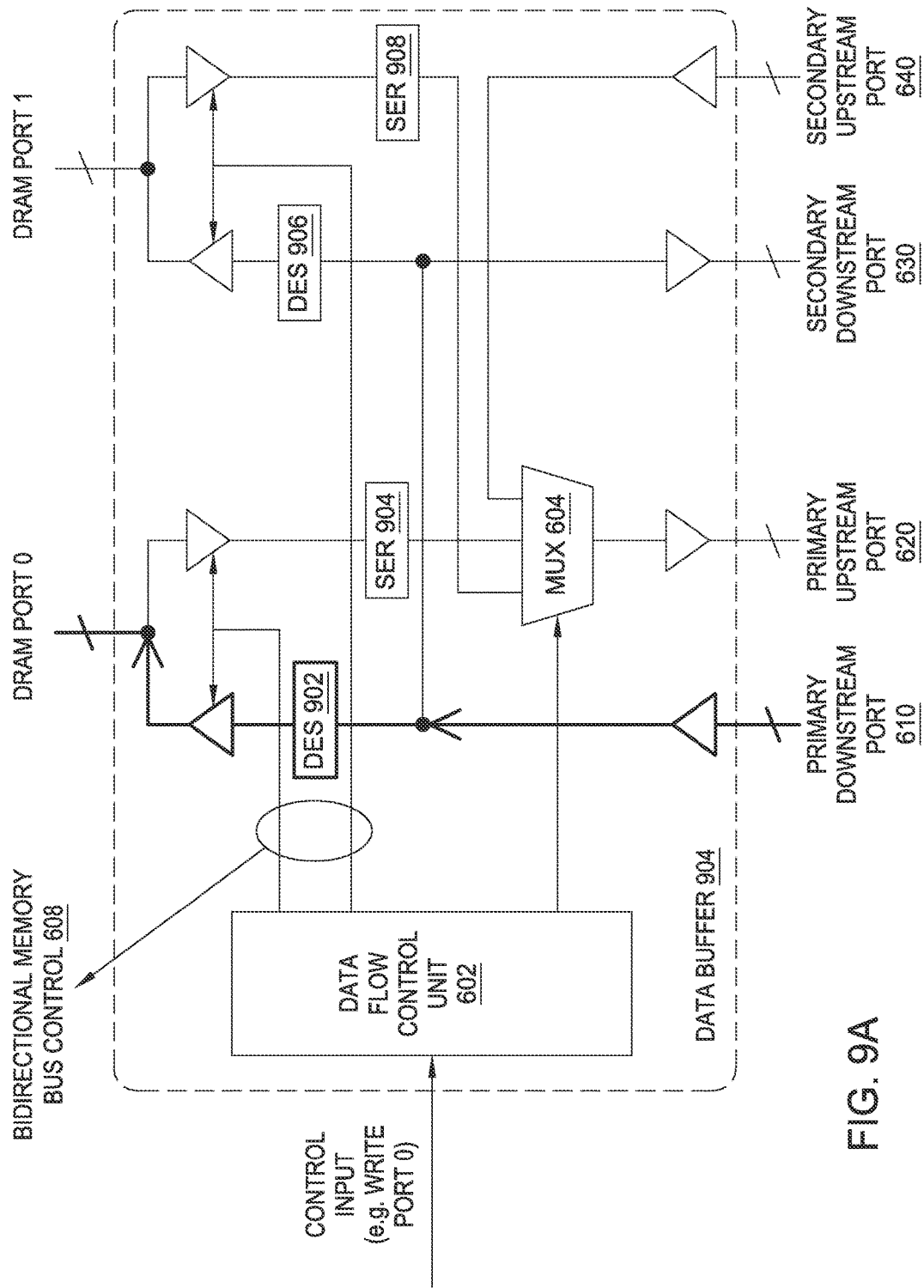
FIGS. 9A-9B illustrate a data buffer configured to deserialize write data, according to various embodiments.
Figure 9B:
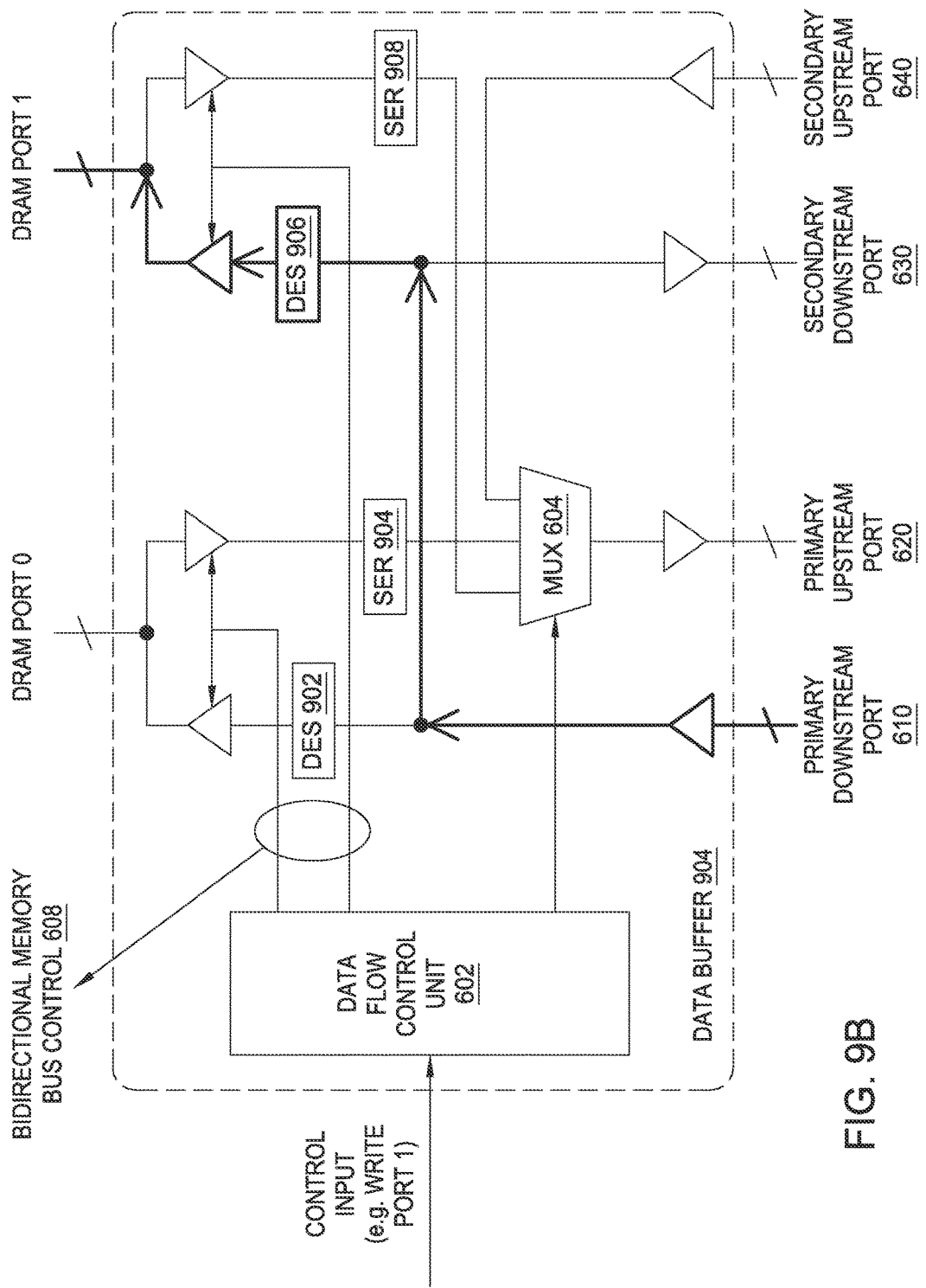
Figure 10A:
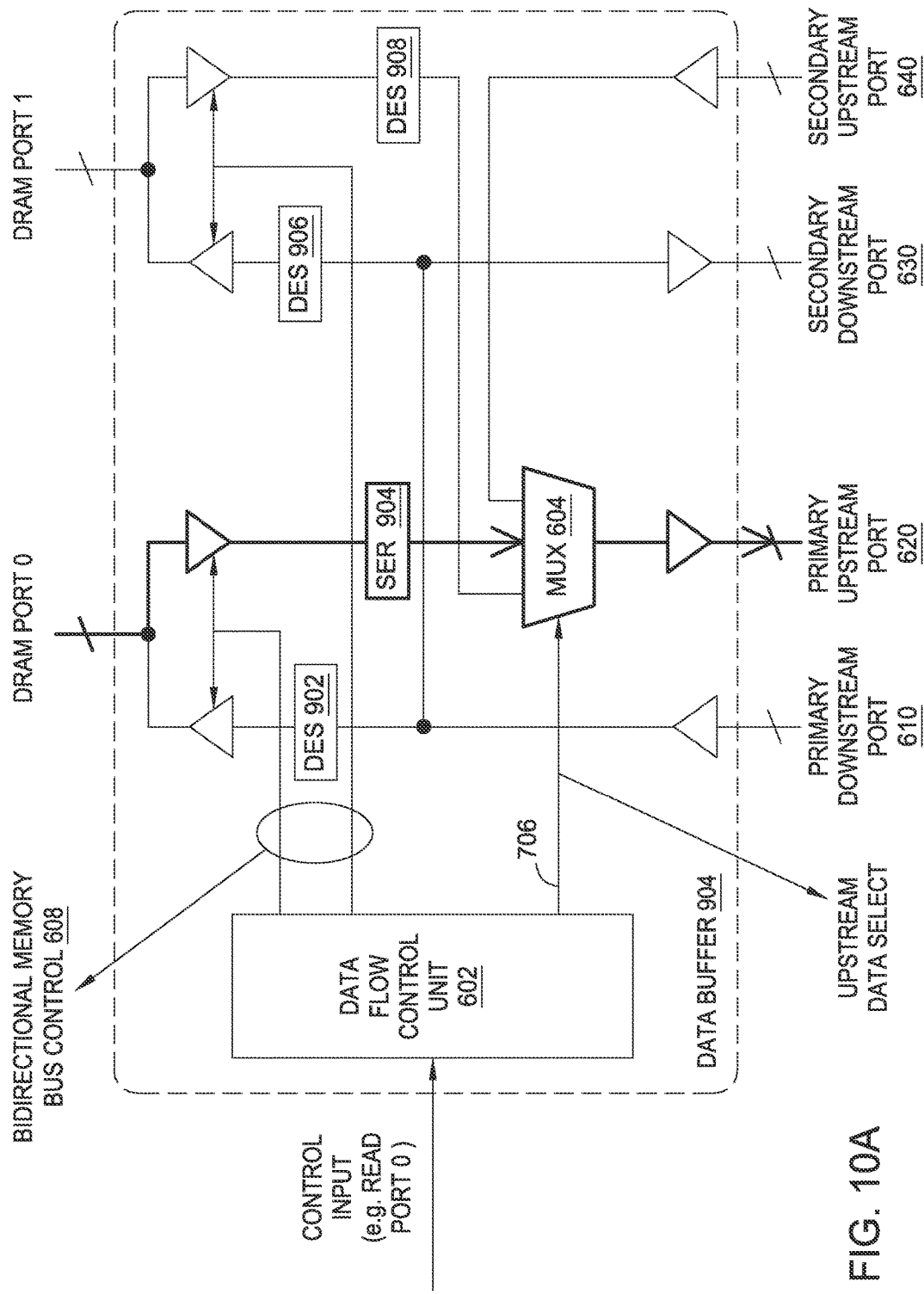
FIGS. 10A-10B illustrate a data buffer configured to serialize read data, according to various embodiments.
Figure 10B:
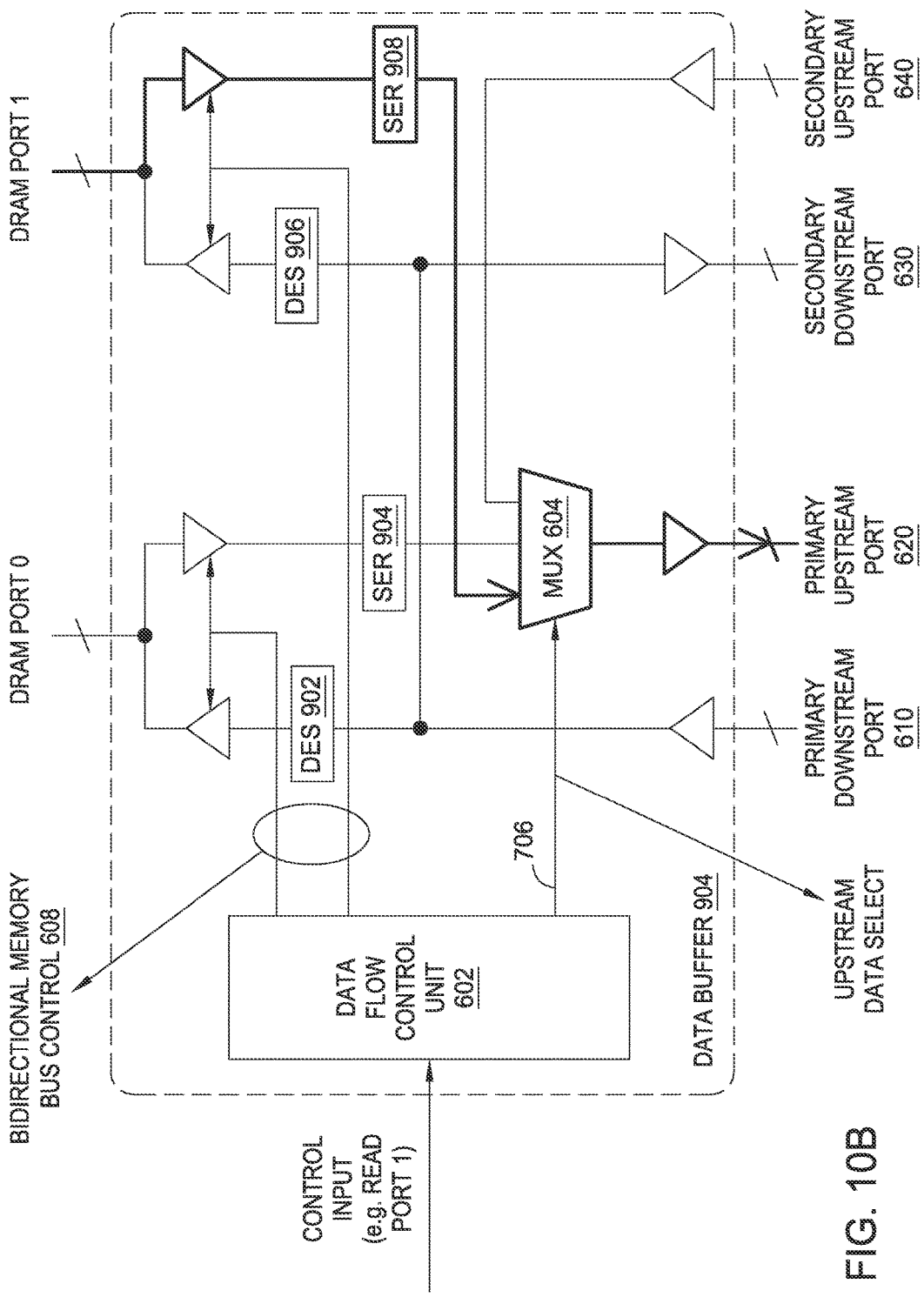

In some embodiments, rather than deserialize and serialize data from other cascaded modules, the data buffer may just perform deserialization and serialization operations for data to be written and/or received from DRAM devices on the same memory module. For example, any data that the data buffer receives that is to be routed to another cascaded memory module can be sent to the cascaded memory module without performing any serialization or deserialization, which may reduce latency (e.g., compared to performing these operations). FIG. 9A-9B illustrate an example of a data buffer 904 configured to deserialize write data to be written to DRAM devices on the same memory module, and FIGS. 10A-10B illustrate an example of a data buffer 904 configured to serialize data to be read from DRAM devices on the same memory module, according to various embodiments. Note that many of the components (e.g., data flow control unit 602, MUX 604, ports 610-640, memory bus control 608, etc.) of the data buffer 904 have same or similar functions as their corresponding components described relative to FIGS. 6A-7C. Therefore, for the sake of convenience, these functions (where the same) may not be described again below in the description.

Compared to the data buffer 804, in this embodiment, the data buffer 904 does not include a DES or SER in any path that is routed to another cascaded memory module. For example, as shown, the data buffer 904 includes a DES 902 between port 610 and DP0, a SER 904 between DP0 and MUX 604, a DES 906 between DP1 and port 630, and a SER 908 between DP1 and MUX 604. The data buffer 904 may use DES 902 and DES 906 to convert the width of the lanes of port 610 to the wider width of the interface used by one of DP0 or DP1. For example, as shown in FIG. 9A, in response to a write command to write data to a DRAM device via DP0, the data buffer 904 uses DES 902 to deserialize the write data received via port 610 before routing the data to the DRAM at DP0. Similarly, as shown in FIG. 9B, in response to a write command to write data to a DRAM device via DP1, the data buffer 904 uses DES 906 to deserialize the write data received via port 610 before routing the data to the DRAM at DP1.

For read operations, the data buffer 904 may use SER 904 and SER 908 to convert the wider width of the lanes of DP0 and DP1 to the narrow width used by the interface at port 620. For example, as shown in FIG. 10A, in response to a read command to read data from a DRAM device at DP0, the data buffer 904 uses SER 904 to serialize data read from the DRAM at DP0 before outputting the read data via port 620. Similarly, as shown in FIG. 10B, in response to a read command to read data from a DRAM at DP1, the data buffer 904 uses SER 908 to serialize data read from the DRAM at DP1 before outputting the data via port 620. Accordingly, by performing deserialization only for write data to be written to DRAMs on the same memory module and/or serializing data for data read from DRAMs on the same memory module, the techniques presented herein may be able to reduce the amount of latency associated with performing these operations.

Figure 11:
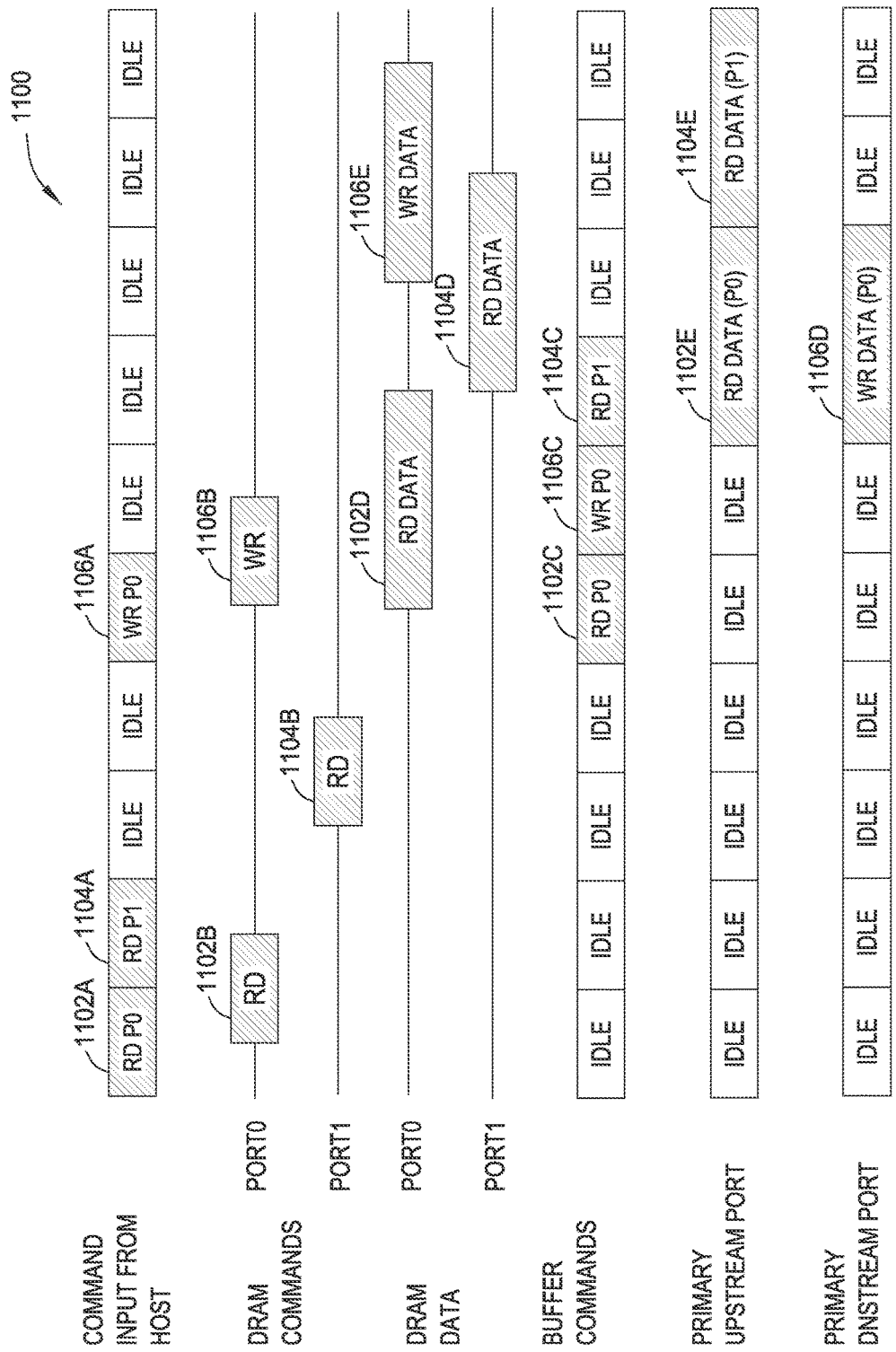
FIG. 11 illustrates a timing diagram for a non-cascaded memory module, according to one embodiment.

FIG. 11 illustrates an example timing diagram 1100 that shows data flow switching within a memory module, according to one embodiment. The timing diagram 1100 illustrates timing for a non-cascaded case or for a memory module that is the last memory module within a memory system. In particular, the timing diagram 1100 illustrates an example timing for a "read P0" command, a "Read P1" command, and a "Write P0" command received from a processor or memory controller.

Referring to the "Read P0" command, at 1102A, the command buffer of the memory module receives a command from a memory controller to read a DRAM device at DP0 on the memory module. Once received, the command buffer generates a read command and forwards the read command to the DRAM located at DP0. The command buffer is also configured to generate and forward a data buffer command based on the command input from the host. At 1102B, the respective DRAM at DP0 receives the read command. After a time delay, the data buffer of the memory module receives, at 1102C, the data buffer command, e.g., indicating the command is a read operation and the particular port to read from. At 1102D, the data buffer receives the read data from the DRAM device at DP0. Subsequently, at 1102E, the data buffer routes the read data from DP0 to the primary upstream port.

Referring to the "Read P1" command, at 1104A, the command buffer receives a command to read a DRAM device at DP1 on the same memory module. At 1104B, the DRAM device receives the read command generated and forwarded by the command buffer. At 1104C, the data buffer receives the data buffer command generated and forwarded by the command buffer. At 1104D, the data buffer receives read data from the DRAM at DP1. At 1104E, the data buffer routes the read data from DP1 to the primary upstream port.

Referring to the "Write P0" command, at 1106A, the command buffer receives a command to write data to a DRAM device on the memory module via DP0. At 1106B, the DRAM device receives the write command generated and forwarded by the command buffer. At 1106C, the data buffer receives the respective data buffer command generated and forwarded by the command buffer. At 1106D, the data buffer receives the write data via the primary downstream port of the data buffer. At 1106E, the data buffer routes the write data from the primary downstream port to the DRAM device on the memory module via DP0.

Figure 12:
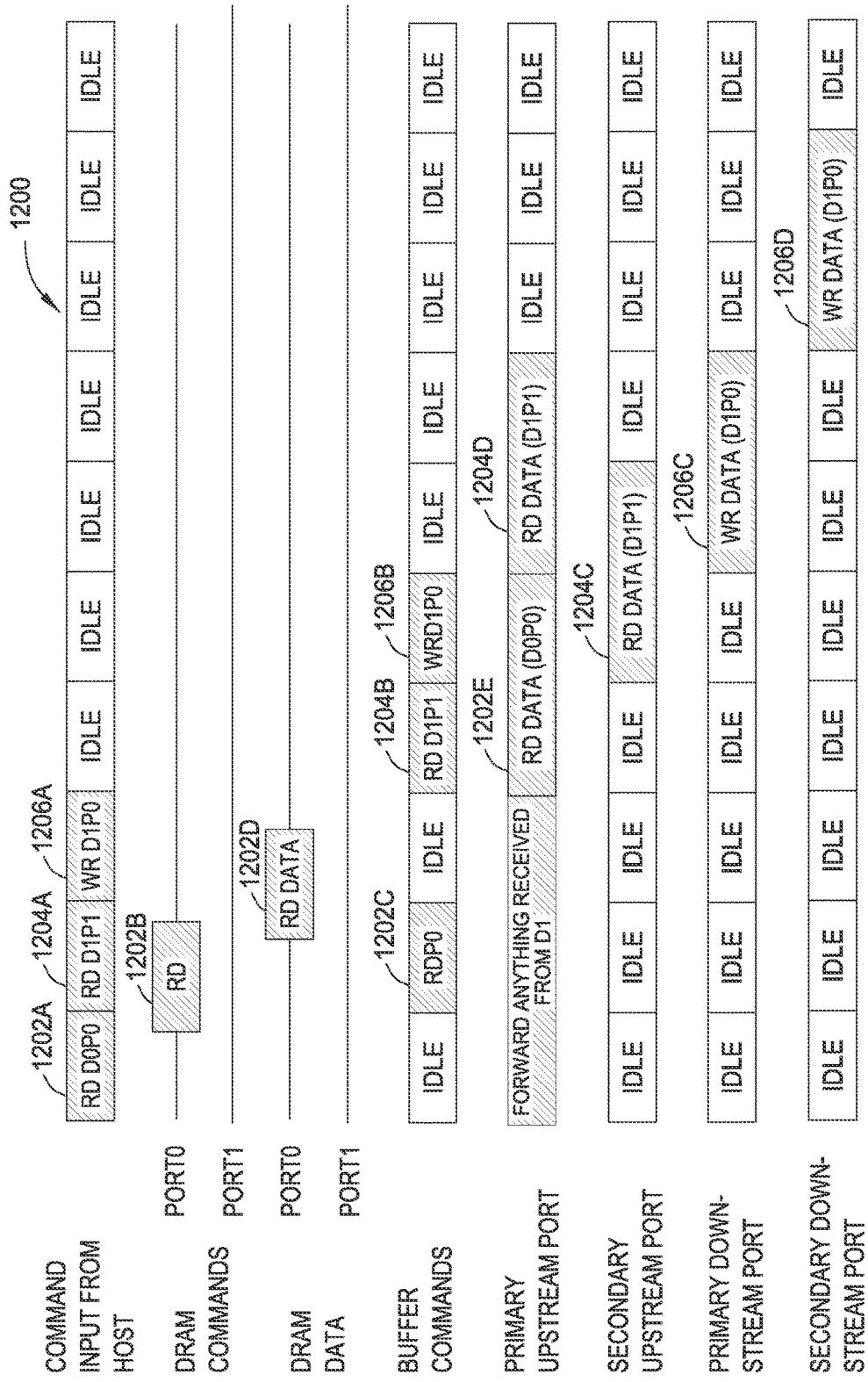
FIG. 12 illustrates a timing diagram for a cascaded memory module, according to one embodiment.

FIG. 12 illustrates an example timing diagram 1200 that shows data flow switching within a memory module, according to one embodiment. The timing diagram 1200 illustrates timing for a cascaded memory module that is upstream relative to another downstream memory module. In particular, the timing diagram 1200 illustrates an example timing for a "read D0 P0" command, a "Read D1 P1" command, and a "Wr D1 P0" command received from a processor or memory controller, where D0 refers to the same memory module and D1 refers to the downstream memory module.

Referring to the "Read D0P0" command, at 1202A, the command buffer receives a command to read a DRAM device at DP0 on the same memory module. At 1202B, the DRAM device receives the read command generated and forwarded by the command buffer. At 1202C, the data buffer receives the data buffer command generated and forwarded by the command buffer. At 1202D, the data buffer receives read data from the DRAM via DP0. At 1202E, the data buffer routes the read data from DP0 to the primary upstream port. Note, the primary upstream port and the secondary upstream port of the data buffer may forward any data D0 receives from D1, whenever D0 is not reading DRAM devices on D0. Similarly, the primary downstream port and the secondary downstream port of the data buffer may forward any data D0 receives to D1, whenever D0 is not writing to DRAM devices on D0.

Referring to the "Read D1P1" command, at 1204A, the command buffer receives a command to read a DRAM device on the downstream memory module (D1). At 1204B, the data buffer receives the data buffer command "Rd D1P1" generated and forwarded by the command buffer. At 1204C, the data buffer receives read data, via the secondary upstream port, from the downstream memory module D1. At 1204D, the data buffer routes the read data from the secondary upstream port to the primary upstream port of D0.

Referring to the "Write D1P0" command, at 1206A, the command buffer receives a command to write to a DRAM device on the downstream memory module D1. At 1206B, the data buffer receives the data buffer command "WrD1P0" generated and forwarded by the command buffer. At 1206C, the data buffer receives write data, via the primary downstream port, from one of a memory controller or another upstream memory module. At 1206D, the data buffer routes the write data from the primary downstream port to the secondary downstream port of D0.

Figure 13:
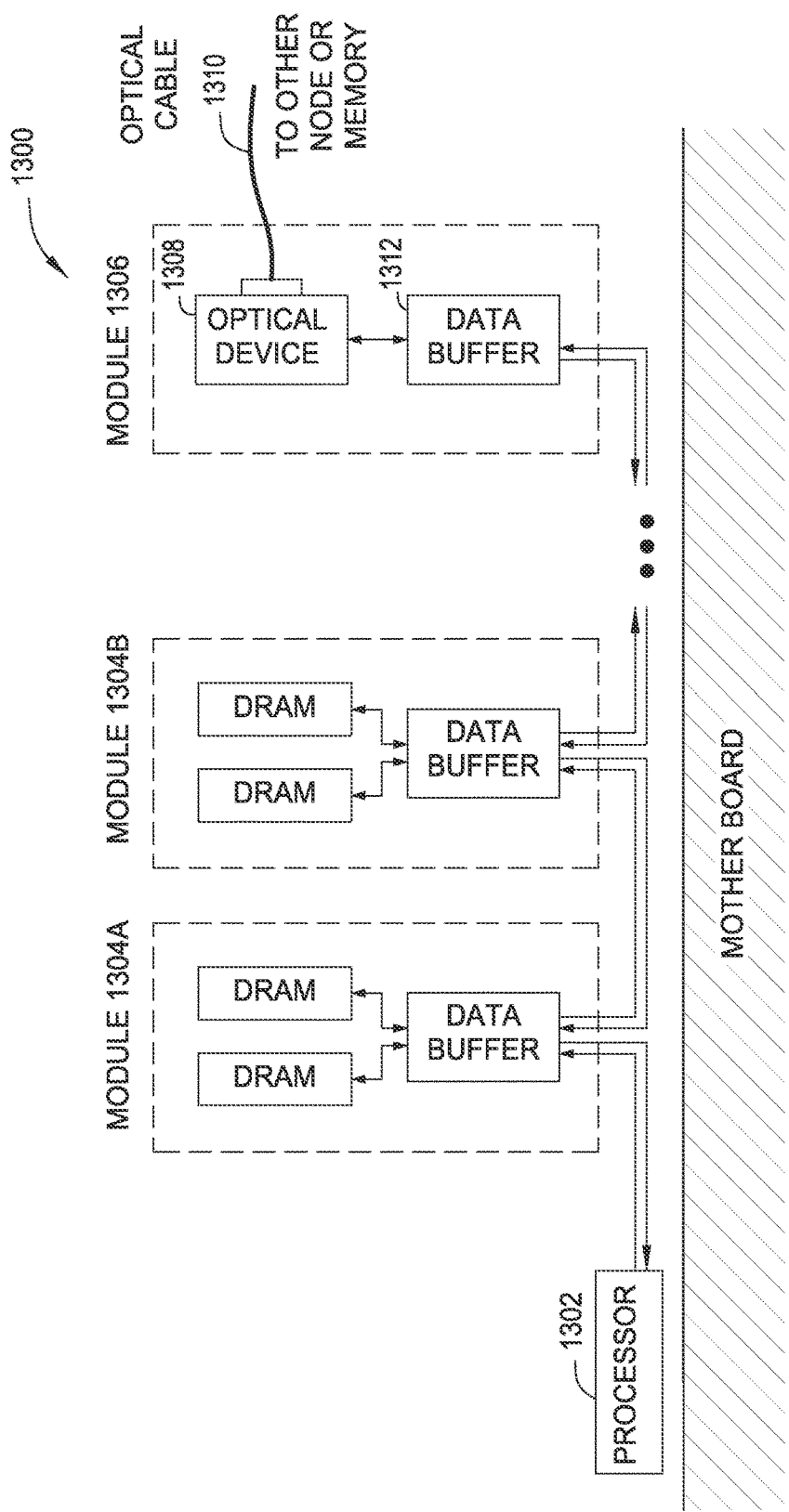
FIG. 13 illustrates another example computer system, according to one embodiment.

FIG. 13 illustrates a computer system 1300 that includes several memory modules cascaded via a data buffer, according to one embodiment. Note that many of the components (e.g., processor 1302, data buffer, DRAMs, etc.) of computer system 1300 have same or similar functions as their corresponding components described relative to the Figures above. Therefore, for the sake of convenience, these functions (where the same) may not be described again below in the description.

As shown, in this embodiment, the computer system 1300 includes a plurality of cascaded memory modules 1304 (e.g., module 1304A, 1304B, etc.), which are similar to the memory modules 106 described above relative to FIG. 3. However, in this embodiment, the computer system 1300 includes a module 1306, which can be built and plugged into the last socket. Module 1306 includes at least one optical transceiver device 1308 that is coupled to a data buffer 1312.

The at least one optical transceiver device 1308 is generally used for sending data to and receiving data from a remote device. For example, the data buffer 1312 is configured to send data to and/or from the optical device(s) 1308 so that the module 1306 can act as a hub to a remote module or a remote system that may not be within the current computer system 1300. To communicate with the remote system, the optical device(s) 1308 can use optical cable 1310.

Module 1306 may or may not have DRAM devices on it. In some embodiments, the data buffer 1312 can be similar to the data buffer 204. The data buffer 1312 can communicate with the optical transceiver device 1308 via the secondary port or one of the DRAM ports. The remote memory system can have any type of memory device, including any type of volatile or non-volatile memory.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a static random access memory (SRAM), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Embodiments of the disclosure may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present disclosure, a user may access applications (e.g., the proxy service) or related data available in the cloud. For example, the proxy service could execute on a trusted computing system in a cloud and perform SAN disk management operations to disk units on behalf of a client of the SAN provider. In such a case, the proxy service could obtain client configuration information and store such information at a storage location in the cloud. Doing so allows a user to access this information from any computing system attached to a network connected to the cloud (e.g., the Internet).

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A memory module in between an upstream memory module of a plurality of cascaded memory modules and a downstream memory module of the plurality of cascaded memory modules in a computing system, the memory module comprising:
    a plurality of dynamic random access memory (DRAM) devices;
    a command buffer configured to receive a set of commands to access data at one or more memory locations of the DRAM devices on the memory module or DRAM devices on the downstream memory module in the computing system; and
    a plurality of data buffers, each different from the command buffer, wherein each data buffer is configured to:
        after receiving, via a first port of the data buffer, serialized write data for a first command of the set of commands, route the serialized write data for the first command to a data buffer of the downstream memory module via a second port of the data buffer;
        receive, via the first port of the data buffer, serialized write data for a second command of the set of commands;
        after de-serializing the serialized write data for the second command, route the de-serialized write data to a DRAM device on the memory module;
        after receiving serialized read data, in response to a third command of the set of commands, from the downstream memory module via a third port of the data buffer, route the serialized read data to the upstream memory module via a fourth port of the data buffer;
        receive, in response to a fourth command of the set of commands, de-serialized read data from a DRAM device on the memory module; and
        after serializing the de-serialized read data, route the serialized read data for the fourth command to the upstream memory module via the fourth port of the data buffer.

2. The memory module of claim 1, wherein the command buffer is configured to generate, from one of the commands:
    a DRAM command to control operation of a DRAM device on the memory module; and
    a data buffer command, different from the DRAM command, to control operation of the data buffers, wherein the data buffer command controls routing of data, in response to the DRAM command, within the data buffers to avoid queueing of the data within the data buffers.

3. The memory module of claim 2, wherein the command buffer is configured to generate the data buffer command based on a reduced set of commands relative to the commands in the set of commands.

4. The memory module of claim 2, wherein the command buffer is configured to generate the data buffer command by deleting at least some information from the one of the commands, wherein the information comprises at least one of an address of a DRAM device on the memory module associated with the DRAM command or a memory operation for a DRAM device associated with the DRAM command.

5. The memory module of claim 2, wherein the command buffer is further configured to apply a time delay to the data buffer command to account for a time delay in routing the read data and write data.

6. A method for routing data by a memory module of a plurality of cascaded memory modules in a computing system, the method comprising:
    receiving, by a command buffer of the memory module, a set of commands to access data at one or more memory locations of dynamic random access memory (DRAM) devices on the memory module or at least one downstream memory module of the plurality of cascaded memory modules in the computing system, wherein the memory module is between an upstream memory module of the plurality of cascaded memory modules and the at least one downstream memory module;
    after receiving, via a first port of a data buffer of a plurality of data buffers of the memory module, serialized write data for a first command of the set of commands, routing the serialized write data for the first command to a data buffer of the downstream memory module via a second port of the data buffer;
    receiving, via the first port of the data buffer, serialized write data for a second command of the set of commands;
    after de-serializing the serialized write data for the second command, routing the de-serialized write data to a DRAM device on the memory module;
    after receiving serialized read data, in response to a third command of the set of commands, from the downstream memory module via a third port of the data buffer, routing the serialized read data to the upstream memory module via a fourth port of the data buffer;

receive, in response to a fourth command of the set of commands, de-serialized read data from a DRAM device on the memory module; and after serializing the de-serialized read data, routing the serialized read data for the fourth command to the upstream memory module via the fourth port of the data buffer, wherein the data buffer is different from the command buffer.

7. The method of claim 6, further comprising generating, from one of the commands:
   a DRAM command to control operation of a DRAM device on the memory module; and
   a data buffer command, different from the DRAM command, to control operation of the data buffers, wherein the data buffer command controls routing of data, in response to the DRAM command, within the data buffers to avoid queuing of the data within the data buffers.

8. The method of claim 7, wherein the data buffer command is generated based on a reduced set of commands relative to the commands in the set of commands.

9. The method of claim 7, wherein the data buffer command is generated by deleting at least some information from the one of the commands, wherein the information comprises at least one of an address of a DRAM device on the memory module associated with the DRAM command or a memory operation for a DRAM device associated with the DRAM command.

10. The method of claim 7, further comprising applying a time delay to the data buffer command to account for a time delay in routing the read data and write data.

11. A memory system, comprising:
    a plurality of cascaded memory modules, each comprising:
       a plurality of dynamic random access memory (DRAM) devices;
       a command buffer configured to receive a set of commands to access data at one or more memory locations of the DRAM devices on the memory module or DRAM devices on at least one downstream memory module; and
       a plurality of data buffers, each different from the command buffer, wherein each data buffer is configured to:
          after receiving, via a first port of the data buffer, serialized write data for a first command of the set of commands, to route the serialized write data for the first command to a data buffer of the downstream memory module via a second port of the data buffer;
          receive, via the first port of the data buffer, serialized write data for a second command of the set of commands;
          after de-serializing the serialized write data for the second command, route the de-serialized write data to a DRAM device on the memory module;
          after receiving serialized read data, in response to a third command of the set of commands, from the downstream memory module via a third port of the data buffer, route the serialized read data to a fourth port of the data buffer;
          receive, in response to a fourth command of the set of commands, de-serialized read data from a DRAM device on the memory module; and
          route the serialized read data for the fourth command to the fourth port.

12. The memory system of claim 11, wherein each memory module is coupled with at least one of:
    an upstream memory module via the third and fourth ports; or
    a downstream memory module via the first and second ports.

13. The memory system of claim 11, further comprising an additional module comprising:
    one or more optical transceivers for sending data to and receiving data from a remote device; and
    an interface for exchanging data with the plurality of cascaded memory modules.

14. The memory system of claim 13, wherein the additional module comprises a plurality of DRAM devices.

* * * * *